United States Patent
Kasai

(10) Patent No.: US 7,355,877 B2
(45) Date of Patent: Apr. 8, 2008

(54) SEMICONDUCTOR DEVICE

(75) Inventor: Hideo Kasai, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/652,678

(22) Filed: Jan. 12, 2007

(65) Prior Publication Data

US 2007/0109898 A1    May 17, 2007

Related U.S. Application Data

(62) Division of application No. 11/033,405, filed on Jan. 12, 2005, now Pat. No. 7,177,171.

(30) Foreign Application Priority Data

Feb. 26, 2004   (JP)   ............................. 2004-050819

(51) Int. Cl.
*G11C 5/06* (2006.01)
(52) U.S. Cl. .......................................... 365/63; 365/51
(58) Field of Classification Search ................. 365/63; 257/274, 777
See application file for complete search history.

(56) References Cited

U.S. PATENT DOCUMENTS

| 6,309,909 | B1 * | 10/2001 | Ohgiyama | ................. 438/112 |
|---|---|---|---|---|
| 6,677,674 | B2 * | 1/2004 | Nagao | ......................... 257/724 |
| 6,963,136 | B2 | 11/2005 | Shinozaki et al. | .......... 257/759 |
| 2004/0063252 | A1 * | 4/2004 | Takahashi | .................... 438/123 |

FOREIGN PATENT DOCUMENTS

JP      07-086526      3/1995

* cited by examiner

*Primary Examiner*—Son Dinh
(74) *Attorney, Agent, or Firm*—Miles & Stockbridge P.C.

(57) ABSTRACT

Each of switching circuits included in each of semiconductor memory chips performs switching among interface functions of predetermined second external connecting electrodes by bonding options in accordance with states of potentials applied to first external connecting electrodes. The second external connecting electrodes intended for interchange of the interface functions are electrodes for plural-bit parallel input/output and electrodes for the input of control signals. For example, the switching circuit interchanges interface functions among the predetermined second external connecting electrodes and switches between valid and invalid states of the interface functions of the predetermined second external connecting electrodes. The second external connecting electrodes intended for interchange may preferably have layouts substantially coincident with one another as viewed in obverse and reverse directions in a state in which the pair of semiconductor memory chips is placed such that their back surfaces overlap each other.

10 Claims, 32 Drawing Sheets

FIG. 2

| Mode | CLE | ALE | /CE | /WE | /RE | /WP | /RES | I/O | Power |
|---|---|---|---|---|---|---|---|---|---|
| Command input | H | L | L | ⎍ | H | × | H | Input | Active |
| Address input | L | H | L | ⎍ | H | × | H | Input | Active |
| Data input | L | L | L | ⎍ | H | × | H | Input | Active |
| Data output | L | L | L | H | ▼ | × | H | Output | Active |
| Output deselect | L | L | L | H | H | × | H | High-Z | Active |
| During rewriting/erasing | × | × | × | × | × | H | H | Input/Output | Active |
| Write protect | × | × | × | × | × | L | H | Input/Output | Active/ standby |
| Standby | × | × | H | × | × | × | H | High-Z | standby*2 |
| Deep standby | × | × | × | × | × | × | L | High-Z | Deep standby*3 |

FIG. 3

| Mode | First cycle | Second cycle | Acceptance in the busy state |
|---|---|---|---|
| Data input | 80H | – | |
| Read mode | 00H | – | |
| Sequential read mode | 0FH | – | |
| Read stop | F0H | – | Acceptance (in Read busy state only) |
| Program | 10H | – | |
| Erase | 60H | D0H | |
| Rewrite | 1FH | – | |
| Status read | 70H | – | Acceptance |
| ID read | 90H | – | |
| Deep standby (setup) | C0H | – | |
| Deep standby (release) | C1H | – | |
| Extended mode | 11H | – | |

FIG. 5

| PAD# | STANDARD | | CORE16 MCP-A | MCP CORE | | CORE8 MCP-A | | MIRROR16 MCP-A | MCP MIRROR | | MIRROR8 MCP-A | |
|---|---|---|---|---|---|---|---|---|---|---|---|---|
| | P.TEST/ MMC | NAND16 | NAND8 | | MCP-B | | MCP-B | | MCP-B | | MCP-B |
| 1 | /DSE | /DSE | /DSE | (/DSE) | (/DSE) | (/DSE) | (/DSE) | (/DSE) | (/DSE) | (/DSE) |
| 2 | /MRES | /MRES | /MRES | (/MRES) | (/MRES) | (/MRES) | (/MRES) | (/MRES) | (/MRES) | (/MRES) |
| 3 | (IO8) | (IO8) | (IO8) | (IO8) | (IO8) | (IO8) | (IO8) | (IO8) | (IO8) | (IO8) |
| 4 | (IO7) | (IO7) | (IO7) | (IO7) | (IO7) | (IO7) | (IO7) | (IO7) | (IO7) | (IO7) |
| 5 | (IO6) | (IO6) | (IO6) | (IO6) | (IO6) | (IO6) | (IO6) | (IO6) | (IO6) | (IO6) |
| 6 | (IO5) | (IO5) | (IO5) | (IO5) | (IO5) | (IO5) | (IO5) | (IO5) | (IO5) | (IO5) |
| 7 | R/B | R/B | R/B | (R/B) | (R/B) | (R/B) | (R/B) | (R/B) | (R/B) | (R/B) |
| 8 | /RE | /RE | /RE | CLE | CLE | CLE | ALE | ALE | ALE | ALE |
| 9 | /CE | /CE | /CE | /WE | /WE | /WE | /CE2 | /CE2 | /CE2 | /CE2 |
| 10 | (PRE) | (PRE) | (PRE) | (PRE) | (PRE) | (PRE) | (PRE) | (PRE) | (PRE) | (PRE) |
| 11 | B.O.NAND | B.O.NAND | B.O.NAND | B.O.NAND | B.O.NAND | B.O.NAND | B.O.NAND | B.O.NAND | B.O.NAND | B.O.NAND |
| 12 | VCC | VCC | VCC | (VCC) | (VCC) | (VCC) | (VCC) | (VCC) | (VCC) | (VCC) |
| 13 | B.O.1.8 | B.O.1.8 | B.O.1.8 | (B.O.1.8) | (B.O.1.8) | (B.O.1.8) | (B.O.1.8) | (B.O.1.8) | (B.O.1.8) | (B.O.1.8) |
| 14 | VCCQ | VCCQ | VCCQ | (VCCQ) | (VCCQ) | (VCCQ) | (VCCQ) | (VCCQ) | (VCCQ) | (VCCQ) |
| 15 | B.O.STD | B.O.STD | B.O.STD | B.O.STD | B.O.STD | B.O.STD | B.O.STD | B.O.STD | B.O.STD | B.O.STD |
| 16 | VSS | VSS | VSS | (VSS) | (VSS) | (VSS) | (VSS) | (VSS) | (VSS) | (VSS) |
| 17 | PROBE | PROBE | PROBE | PROBE | PROBE | PROBE | PROBE | PROBE | PROBE | PROBE |
| 18 | (RES) | (RES) | (RES) | (RES) | (RES) | (RES) | (RES) | (RES) | (RES) | (RES) |
| 19 | CLE | CLE | CLE | /WP | /WP | /WP | /WP | /WP | /WP | /WP |
| 20 | ALE | ALE | ALE | /CE2 | /CE2 | ALE | (NC) | (NC) | (NC) | (NC) |
| 21 | /WE | /WE | /WE | ALE | ALE | (NC) | /WE | /WE | /WE | /WE |
| 22 | /WP | /WP | /WP | (NC) | (NC) | (NC) | CLE | CLE | CLE | CLE |
| 23 | (IO4) | (IO4) | (IO4) | (IO4) | (IO4) | (IO4) | (IO4) | (IO4) | (IO4) | (IO4) |
| 24 | (IO3) | (IO3) | (IO3) | (IO3) | (IO3) | (IO3) | (IO3) | (IO3) | (IO3) | (IO3) |
| 25 | (IO2) | (IO2) | (IO2) | (IO2) | (IO2) | (IO2) | (IO2) | (IO2) | (IO2) | (IO2) |
| 26 | (IO1) | (IO1) | (IO1) | (IO1) | (IO1) | (IO1) | (IO1) | (IO1) | (IO1) | (IO1) |
| 27 | (Vmoni1) | (Vmoni1) | (Vmoni1) | (Vmoni1) | (Vmoni1) | (Vmoni1) | (Vmoni1) | (Vmoni1) | (Vmoni1) | (Vmoni1) |
| 28 | (Vmoni2) | (Vmoni2) | (Vmoni2) | (Vmoni2) | (Vmoni2) | (Vmoni2) | (Vmoni2) | (Vmoni2) | (Vmoni2) | (Vmoni2) |
| 29 | (Vmoni3) | (Vmoni3) | (Vmoni3) | (Vmoni3) | (Vmoni3) | (Vmoni3) | (Vmoni3) | (Vmoni3) | (Vmoni3) | (Vmoni3) |
| 30 | (Vmoni4) | (Vmoni4) | (Vmoni4) | (Vmoni4) | (Vmoni4) | (Vmoni4) | (Vmoni4) | (Vmoni4) | (Vmoni4) | (Vmoni4) |

FIG. 6

| | STANDARD | | MCP CORE | | | | MCP MIRROR | | | |
|---|---|---|---|---|---|---|---|---|---|---|
| PAD# | P TEST/ MMC | NAND16 | NAND8 | CORE16 MCP-A | CORE8 MCP-A | MCP-B | MCP-B | MIRROR16 MCP-A | MCP-B | MIRROR8 MCP-A | MCP-B |
| 31 | (NC) | (NC) | (NC) | /CE1 | /CE1 | /CE1 | (NC) | (NC) | (NC) | (NC) | (NC) |
| 32 | (VCCQ) | (VCCQ) | (VCCQ) | VCCQ | VCCQ | VCCQ | (VCCQ) | (VCCQ) | (VCCQ) | (VCCQ) | (VCCQ) |
| 33 | VSS | VSS | VSS | VSS | VSS | VSS | VSS | VSS | VSS | VSS | VSS |
| 34 | (B.O.MIR) | (B.O.MIR) | (B.O.MIR) | B.O.MIR | B.O.MIR | B.O.MIR | (B.O.MIR) | (B.O.MIR) | (B.O.MIR) | (B.O.MIR) | (B.O.MIR) |
| 35 | (NC) | (NC) | (NC) | (NC) | (NC) | (NC) | /RE | /RE | /RE | /RE | /RE |
| 36 | IO16 | IO16 | IO16 | IO16 | IO16 | IO16 | IO1 | IO1 | IO1 | IO1 | IO1 |
| 37 | IO8 | IO8 | IO8 | IO8 | IO8 | IO8 | IO9 | IO9 | IO9 | IO9 | IO9 |
| 38 | IO15 | IO15 | IO15 | IO15 | IO15 | IO15 | IO2 | IO2 | IO2 | IO2 | IO2 |
| 39 | IO7 | IO7 | IO7 | IO7 | IO7 | IO7 | IO10 | IO10 | IO10 | IO10 | IO10 |
| 40 | IO14 | IO14 | IO14 | IO14 | IO14 | IO14 | IO3 | IO3 | IO3 | IO3 | IO3 |
| 41 | IO6 | IO6 | IO6 | IO6 | IO6 | IO6 | IO11 | IO11 | IO11 | IO11 | IO11 |
| 42 | IO13 | IO13 | IO13 | IO13 | IO13 | IO13 | IO4 | IO4 | IO4 | IO4 | IO4 |
| 43 | IO5 | IO5 | IO5 | IO5 | IO5 | IO5 | IO12 | IO12 | IO12 | IO12 | IO12 |
| 44 | PRE | PRE | PRE | (PRE) | (PRE) | (PRE) | (PRE) | (PRE) | (PRE) | (PRE) | (PRE) |
| 45 | B.O.X8 | B.O.X8 | B.O.X8 | B.O.X8 | B.O.X8 | B.O.X8 | B.O.X8 | B.O.X8 | B.O.X8 | B.O.X8 | B.O.X8 |
| 46 | VCC | VCC | VCC | VCC | VCC | VCC | VCC | VCC | VCC | VCC | VCC |
| 47 | (B.O.1.8) | (B.O.1.8) | (B.O.1.8) | B.O.1.8 | B.O.1.8 | B.O.1.8 | B.O.1.8 | B.O.1.8 | B.O.1.8 | B.O.1.8 | B.O.1.8 |
| 48 | VCCQ | VCCQ | VCCQ | (VCCQ) | (VCCQ) | (VCCQ) | (VCCQ) | (VCCQ) | (VCCQ) | (VCCQ) | (VCCQ) |
| 49 | VSS | VSS | VSS | (VSS) | (VSS) | (VSS) | (VSS) | (VSS) | (VSS) | (VSS) | (VSS) |
| 50 | IO12 | IO12 | IO12 | IO12 | IO12 | IO12 | IO5 | IO5 | IO5 | IO5 | IO5 |
| 51 | IO4 | IO4 | IO4 | IO4 | IO4 | IO4 | IO13 | IO13 | IO13 | IO13 | IO13 |
| 52 | IO11 | IO11 | IO11 | IO11 | IO11 | IO11 | IO6 | IO6 | IO6 | IO6 | IO6 |
| 53 | IO3 | IO3 | IO3 | IO3 | IO3 | IO3 | IO14 | IO14 | IO14 | IO14 | IO14 |
| 54 | IO10 | IO10 | IO10 | IO10 | IO10 | IO10 | IO7 | IO7 | IO7 | IO7 | IO7 |
| 55 | IO2 | IO2 | IO2 | IO2 | IO2 | IO2 | IO15 | IO15 | IO15 | IO15 | IO15 |
| 56 | IO9 | IO9 | IO9 | IO9 | IO9 | IO9 | IO8 | IO8 | IO8 | IO8 | IO8 |
| 57 | IO1 | IO1 | IO1 | IO1 | IO1 | IO1 | IO16 | IO16 | IO16 | IO16 | IO16 |
| 58 | (NC) | (NC) | (NC) | /RE | /RE | /RE | (NC) | (NC) | (NC) | (NC) | (NC) |
| 59 | (B.O.AdU) | (B.O.AdU) | (B.O.AdU) | B.O.AdU | B.O.AdU | B.O.AdU | B.O.AdU | B.O.AdU | B.O.AdU | B.O.AdU | B.O.AdU |
| 60 | VSS | VSS | VSS | VSS | VSS | VSS | VSS | VSS | VSS | VSS | VSS |
| 61 | (B.O.CE1) | (B.O.CE1) | (B.O.CE1) | B.O.CE1 | B.O.CE1 | B.O.CE1 | B.O.CE1 | B.O.CE1 | B.O.CE1 | B.O.CE1 | B.O.CE1 |
| 62 | (VCCQ) | (VCCQ) | (VCCQ) | VCCQ | VCCQ | VCCQ | VCCQ | VCCQ | VCCQ | VCCQ | VCCQ |
| 63 | (NC) | (NC) | (NC) | (NC) | (NC) | /CE1 | /CE1 | /CE1 | /CE1 | /CE1 | /CE1 |

FIG. 7

| | STANDARD | MCP CODE | MCP MIRROR |
|---|---|---|---|
| B.O.STD | VSS | Open | Open |
| B.O.MIR | Open | VSS | Open |

| | | |
|---|---|---|
| B.O.AdU | HIGH ORDER AT VSS CONNECTION, LOW ORDER AT OPEN | |

| | OPEN | VCC CONNECTION | VSS CONNECTION |
|---|---|---|---|
| B.O.1.8 | I/O3.3V | ADAPT TO I/O1.8V | — |
| B.O.CE | /CE2 VALID | — | /CE1 VALID |
| B.O.X8 | ×16 | ×8 | — |
| B.O.NAND | super-AND | NAND | — |
| PROBE | PAD AT BOTH SIDES | | PAD ON LEFT ONE SIDE |

FIG. 29

| Clock Cycle | I/O8 | I/O7 | I/O6 | I/O5 | I/O4 | I/O3 | I/O2 | I/O1 |
|---|---|---|---|---|---|---|---|---|
| First cycle (CA1) | A7 | A6 | A5 | A4 | A3 | A2 | A1 | A0 |
| Second cycle (CA2) | L* | L* | L* | L* | L* | A10 | A9 | A8 |
| Third cycle (SA1) | A18 | A17 | A16 | A15 | A14 | A13 | A12 | A11 |
| Fourth cycle (SA2) | L* | L/H | A24 | A23 | A22 | A21 | A20 | A19 |

FIG. 30

| Clock Cycle | I/O8 | I/O7 | I/O6 | I/O5 | I/O4 | I/O3 | I/O2 | I/O1 |
|---|---|---|---|---|---|---|---|---|
| First cycle (CA1) | A7 | A6 | A5 | A4 | A3 | A2 | A1 | A0 |
| Second cycle (CA2) | L* | L* | L* | L* | L* | L* | A9 | A8 |
| Third cycle (SA1) | A17 | A16 | A15 | A14 | A13 | A12 | A11 | A10 |
| Fourth cycle (SA2) | L* | L/H | A23 | A22 | A21 | A20 | A19 | A18 |

SEMICONDUCTOR DEVICE

CROSS-REFERENCE TO RELATED APPLICATION

This application is a division of application Ser. No. 11/033,405 filed Jan. 12, 2005 now U.S. Pat. No. 7,177,171.

The present application claims priority from Japanese patent application No. 2004-050819 filed on Feb. 26, 2004, the content of which is hereby incorporated by reference into this application.

BACKGROUND OF THE INVENTION

The present invention relates to a semiconductor device having a semiconductor memory chip, and to a technique effective for application to a semiconductor device of an MCP (Multi Chip Package) structure in which semiconductor memory chips are laminated and mounted with an TSOP (Thin Small Outline Package).

When two semiconductor memory chips of the same kind are laminated on each other to realize an MCP, bonding pads having the same interface functions such as an address input, a data input/output, etc. are generally bonded to the same lead terminals in both semiconductor memory chips. When the two semiconductor memory chips of the same kind are laminated on each other with their back surfaces being placed face to face to each other at this time, the positions of most bonding pads having the same interface functions are distant from one another where the arrangements or layouts of the bonding pads of the two semiconductor memory chips are exactly the same. Thus, the bonding pads placed in the positions where they are spaced away from one another, must be wire-bonded to a common lead terminal, thus encountering a substantial difficulty in making the bonding pads to intersect other bonding wires without a short circuit.

In order to solve it, mirror-symmetrical chips are formed using new mask patterns obtained by mirror-reversing mask patterns of all layers, or chips changed in wiring layer are formed to make only bonding pads mirror-symmetrical, thereby making it possible to cope with it.

A patent document 1 (Japanese Unexamined Patent Publication No. Hei 7 (1995)-86526) describes the realization of a memory device wherein when two semiconductor memory chips identical to each other are laminated on each other with their back surfaces being placed face to face, interface functions of the same kind are connected to one another as in the case of a connection of address inputs to each other, a connection of data inputs/outputs to each other without sticking to a connection of bonding pads having the same interface functions to one another, and the chips are selected separately, thereby providing double memory capacity without a fear of signal collision.

SUMMARY OF THE INVENTION

However, a new problem arises in that when the mask patterns of all the layers are mirror-reversed or the new mirror-symmetric chips changed in wiring layer are formed to cope with the above, the cost of the semiconductor device rises and the delivery time of the semiconductor device becomes long, and hence chip management becomes cumbersome.

In the technique described in the patent document 1, an access main body which access-controls the memory device, must perform access between the two semiconductor memory chips with the high and low ranks of addresses and data being interchanged. Therefore, there is a need to develop new hardware or software which copes with it.

The present inventors have paid attention to a case in which it is advisable to make variations in the number of parallel input/output data bits, make lamination on other type of memory chip and change interface functions of bonding pads in a semiconductor memory chip even when the semiconductor memory chip and a controller chip that access-controls the semiconductor memory chip are mounted in a card substrate in addition to the MCP structure of each of the semiconductor memory chips of the same kind. When mask patterns of all layers are reversed and new chips changed in wiring layer are formed in a manner similar to the above even at this time, the cost rises and the delivery time becomes long, and hence chip management becomes cumbersome.

An object of the present invention is to provide a semiconductor device of a multichip package structure using a plurality of semiconductor memory chips without aligning chips for mirror symmetry, which use mirror-reversed mask patterns of all layers and option masks for metal wiring and imposing a processing burden such as high/low-order inversion of addresses or data on an access main body.

Another object of the present invention is to provide a semiconductor device which eliminates the need for variations in the number of parallel input/output data bits, lamination on other type of memory chip and inversion of mask patterns of all layers and formation of new chips changed in wiring layer to change interface functions of bonding pads in a semiconductor memory chip even when the semiconductor memory chip and a controller chip that access-controls the semiconductor memory chip are mounted in a card substrate.

The above, and other objects and novel features of the present invention will become apparent from the description of the present specification and the accompanying drawings.

Summaries of representative ones of the inventions disclosed in the present application will be described in brief as follows:

[1] There is provided a semiconductor device wherein switching circuits (4A, 18A, 50, 54, 60 and 70) are included in a semiconductor memory chip formed with a plurality of semiconductor elements and a plurality of external connecting electrodes. Each of the switching circuits performs switching among interface functions of predetermined second external connecting electrodes (I/O1 through I/O16, /CE, /WE, . . . , INA, INB, OUTA', OUTB') by bonding options in accordance with states of potentials applied to first external connecting electrodes (B.O.STD, B.O.MIR, . . . , BOP). A semiconductor device of either a packaged form or a non-packaged form is also intended for its use.

The interface functions of for the second external connecting electrodes are switched by bonding options with respect to the first external connecting electrodes. Therefore, when a semiconductor device of a multichip package structure using a plurality of semiconductor memory chips is realized, there is no need to align chips for mirror symmetry, which use mirror-reversed mask patterns of all layers and option masks for metal wiring, and there is no need to impose a processing burden such as high/low-order inversion of addresses or data on an access main body.

As a specific form of the present invention, the second external connecting electrodes intended for interface function switching are electrodes (I/O1 through I/O16, . . . ) for plural-bit parallel input/output and electrodes (/CE, /WE, . . . ) for the input of control signals. External connecting electrodes (VCC, VSS, VCCQ) for supplying power are excepted from the electrodes intended for the interface function switching. This is because since a switch and a logic gate are used for switching of each interface function, and the switch or the like needs an extremely large current supply capacity for the purpose of switching of power supply electrodes, it is not realistic that the power supply external connecting electrodes are intended for switching of the interface functions.

As another specific form of the present invention, the switching circuit (50, 54) switches between valid and invalid states of the interface function of each of the predetermined second external connecting electrodes. When the number of parallel data input/output bits is 16 bits at the maximum, for example, 8 bits are selectively taken.

As a further specific form of the present invention, the switching circuit (60, 70) interchanges interface functions among the predetermined second external connecting electrodes. When the number of parallel data input/output bits is 8 bits, for example, a first bit and an eighth bit, a second bit and a seventh bit, a third bit and a sixth bit, and a fourth bit and a fifth bit are interchanged selectively. Taking into consideration that a multichip package structure is realized by superimposing the same semiconductor memory chips with their back surfaces being butted against each other, using the interchange function, the second external connecting electrodes intended for interchange of the interface functions may preferably have layouts substantially coincident with one another as viewed in obverse and reverse directions in a state in which the pair of semiconductor memory chips is placed such that their back surfaces overlap each other. In other words, the second external connecting electrodes intended for interchange of the interface functions may preferably have layouts symmetrical with predetermined external connecting electrodes of the external connecting electrodes arranged on one side of the chip being placed as the center. Thus, when the same semiconductor memory chips are superimposed on each other with their back surfaces being butted against each other, the predetermined second external connecting electrodes each having the same function take the same positions at their obverse and reverse sides. Thus, it is possible to prevent bonding wires which commonly connect the second external connecting electrodes of the same function to the same lead terminal from contacting other wires.

As a still further form of the present invention, the semiconductor memory chip may further include a control circuit (10A) which performs switching of a control function for an input sent from a predetermined external connecting electrode by a bonding option in accordance with a state of a potential applied to a third external connecting electrode.

For example, the control circuit judges a command input relevant to an address input cycle as invalid where a bit ranked as being higher by one than an address most significant bit of the semiconductor memory chip, which is inputted in the address input cycle, is a first logical value when the third external connecting electrode (B.O.AdU) is of a first potential state, and judges as valid, a command input relevant to an address input cycle when above bit is a second logical value. When the third external connecting electrode is a second potential state, the control circuit ignores the bit ranked as being higher by one than the address most significant bit of the semiconductor memory chip, which is inputted in the address input cycle. This means that when the external connecting electrodes for the selection of addresses, data and chips are connected in common between the semiconductor memory chips of the same kind to provide MCP structurization, the corresponding semiconductor memory chip is selected and made accessible, so that an address space as seen from outside the semiconductor device can be extended. In a use form in which the semiconductor memory chips of the same kind are individually chip-selected, the third external connecting electrode is set to a second potential state. In a use form in which the selection of the semiconductor memory chips and the address input are respectively made common in the MCP structure, the third external connecting electrode is set to a first potential state with respect to one semiconductor memory chip, whereas the third external connecting electrode is set to the second potential state with respect to the other semiconductor memory chip. When the bit ranked as being higher by one than the address most significant bit is of first logic, the access operation of the other semiconductor memory chip is made possible, whereas when the above bit is of second logic, the operation of the-one semiconductor memory chip is enabled.

When the third external connecting electrode is of the first potential state in the above where instructions for a read operation with no address input are given, the start of the read operation is inhibited. In brief, when such power-on-read or the like that initial-setting data or the like stored in a non-volatile memory element of the semiconductor memory chip is outputted outside at power-on of the semiconductor memory chip to make initial loading possible is instructed, both the one semiconductor memory chip and the other semiconductor memory chip are operated to prevent inconvenience developed due to collision of read data before happens. Therefore, it is possible to allow only the one semiconductor memory chip to carry out the power-on-read or the like.

[2] Another semiconductor device according to the present invention is intended for a packaged form in particular and has a structure wherein a pair of semiconductor memory chips each including a plurality of bonding pads disposed at a marginal portion thereof is laminated on each other, and terminals of a package and their corresponding bonding pads are connected by bonding wires. Each of the semiconductor memory chips includes at least one switching circuit which interchanges interface functions among predetermined second bonding pads by bonding options in accordance with a first potential state or a second potential state of a first bonding pad. The second bonding pads intended for interchange of the interface functions are plural-bit parallel input/output bonding pads and predetermined bonding pads selected from control-signal input bonding pads. The bonding pads intended for interchange of the interface functions have layouts substantially coincident with one another as viewed in obverse and reverse directions in a state in which the pair of semiconductor memory chips is placed such that their back surfaces overlap each other. One of the pair of semiconductor memory chips is bonded in such a manner that the first bonding pad is brought to a first potential state, and the other thereof is bonded in such a manner that the first bonding pad is brought to a second potential state.

When the number of parallel data input/output bits is 8 bits, for example, the switching circuit that interchanges the interface functions among the predetermined second bonding pads selectively interchanges a first bit and an eighth bit, a second bit and a seventh bit, a third bit and a sixth bit, and a fourth bit and a fifth bit. When a multichip package structure is realized by superimposing the pair of semiconductor memory chips with their back surfaces being butted against each other, using the interchange function, the second bonding pads intended for interchange of the interface functions, i.e., ones having the same functions are placed so as to substantially coincide with one another as viewed in obverse and reverse directions in a state in which the pair of semiconductor memory chips is placed such that their back surfaces overlap each other. Therefore, it is possible to avoid the contact of bonding wires that common-connects the second bonding pads having the same functions to the same lead terminal with other wires.

As a specific form of the present invention, a TSOP package structure is adopted as the structure of the package, and the terminals of the package are configured as lead terminals (31) at this time. It is essential that in the TSOP package structure, measures against the contact among the bonding wires (32) are taken by the layout of bonding pads to avoid the contact.

As another specific form of the present invention, a CSP (Chip Size Package) structure is provided as the structure of the package, and the terminals of the package are configured as bonding pads (42) formed in the surface of a package substrate (41). When semiconductor memory chips of the same kind are mounted in both surfaces of a package substrate with a signal wiring layer formed as a single layer, such a configuration so as to be similar to the above is taken. When the semiconductor memory chips of the same kind are mounted in both surfaces of a multilayered wiring board using the multilayered wiring board, the complication of the constitution of a wring layer of the multilayered wiring board enables coping with such a case even if two memory chips exactly identical in layout configuration of bonding pads are used. However, the cost of such a multilayered wiring board becomes significantly higher than that of a single-layered wiring board.

[3] A further semiconductor device according to the present invention has a semiconductor memory chip including a plurality of bonding pads disposed at a marginal portion thereof. Terminals of a mounting board and their corresponding bonding pads are connected by bonding wires. The semiconductor memory chip includes at least one switching circuit which validates signal interface functions of bonding pads disposed at a predetermined marginal portion of one side of the semiconductor memory chip in accordance with a first potential state of a first bonding pad, and invalidates signal interface functions of bonding pads disposed at a predetermined marginal portion of the other side of the semiconductor memory chip. The first bonding pad is bonded to the corresponding terminal on the mounting board, for bringing the first bonding pad to the first potential state. This is suitable for such an application that the semiconductor memory chip is connected to the terminals of the mounting board by using the bonding pads lying on one side of the semiconductor memory chip.

As a specific form of the present invention, a controller chip which access-controls the semiconductor memory chip, is provided. The second bonding pads, which make valid the signal interface functions in the semiconductor memory chip, are respectively connected to memory interface terminals of the controller chip. External interface terminals of the controller chip are respectively connected to external interface terminals (24) of the mounting board (22). The controller chip has a card host interface function based on predetermined memorycard specs, for example.

[4] A semiconductor device of the present invention according to an aspect of a switching circuit having paid attention to the selection of each output path has an output switching circuit (70) included in at least one semiconductor memory chip formed with a plurality of semiconductor elements and a plurality of external connecting electrodes. In response to a state in which a first voltage is applied to a first external connecting electrode (BOP), the output switching circuit selects an output path which outputs a first signal (OUTA) formed by a first circuit (71) comprising predetermined circuit elements to a second external connecting electrode (OUTA') and an output path which outputs a second signal (OUTB) formed by a second circuit (72) comprising predetermined circuit elements to a third external connecting electrode (OUTB'). In response to a state in which a second voltage is applied to the first external connecting electrode, the output switching circuit selects an output path which outputs the first signal to the third external connecting electrode and an output path which outputs the second signal to the second external connecting electrode.

A semiconductor device of the present invention according to an aspect of a switching circuit having paid attention to the selection of each input path has an input switching circuit (60) included in at least one semiconductor memory chip formed with a plurality of circuit elements and a plurality of external connecting electrodes. In response to a state in which a first voltage is applied to a first external connecting electrode (BOP), the input switching circuit selects an input path which supplies a first signal inputted from a second external connecting electrode (INA) to a first circuit (65) comprising predetermined circuit elements, and an input path which supplies a second signal inputted from a third external connecting electrode (INB) to a second circuit (66) comprising predetermined circuit elements. In response to a state in which a second voltage is applied to the first external connecting electrode, the input switching circuit selects an input path which supplies the first signal inputted from the second external connecting electrode to the second circuit, and an input path which supplies the second signal inputted from the third external connecting electrode to the first circuit.

[5] In a semiconductor device according to a further aspect of a switching circuit, the switching circuit is included in a semiconductor chip formed with a plurality of circuit elements and a plurality of external connecting electrodes. The switching circuit performs switching among interface functions of external connecting electrodes in accordance with a program state relative to a fuse. The fuse is defined as a laser fuse which stores information corresponding to the presence or absence of cutoff thereof by laser, an electrical fuse which stores information corresponding to the presence or absence of cutoff thereof by Joule heat, or an electrically erasable and programmable flash fuse.

The flash fuse is excepted from an interface function switching application of a reset external connecting electrode to which instructions as to a reset operation are inputted. This is because since information stored in the flash fuse is initially set to an internal register or the like by being read in response to the instructions as to the reset operation, the use of the flash fuse in the interface function switching application of the reset external connecting electrode to which the instructions as to the reset operation are inputted, is disadvantageous.

Advantageous effects obtained by representative ones of the inventions disclosed in the present application will be explained in brief as follows:

A semiconductor device of a multichip package structure using a plurality of semiconductor memory chips without aligning chips for mirror symmetry, which use mirror-reversed mask patterns of all layers and option masks for metal wiring and imposing a processing burden such as high/low-order inversion of addresses or data on an access main body can be realized.

A semiconductor device can be provided which eliminates the need for variations in the number of parallel input/output data bits, lamination on other type of memory chip, and inversion of mask patterns of all layers and formation of new chips changed in wiring layer to change interface functions of bonding pads in a semiconductor memory chip even when the semiconductor memory chip and a controller chip that access-controls the semiconductor memory chip are mounted in a card substrate.

BRIEF DESCRIPTION OF THE DRAWINGS

FIG. 2 is an explanatory view showing in order, respective operation modes of an address input, a command input and data input/output operations of the flash memory chip, which are instructed by access control signals;

FIG. 3 is an explanatory view illustrating the definition of commands supported by the flash memory chip;

FIG. 5 is an explanatory view showing modes for switching between interface functions of bonding pads employed in the flash memory chip together with FIG. 6;

FIG. 6 is an explanatory view showing modes for switching between interface functions of bonding pads employed in the flash memory chip together with FIG. 5;

FIG. 7 is an explanatory view showing at sight, functions of bonding option pads and their setting methods;

FIG. 29 is an explanatory view showing an address input state based on address input cycles employed in a flash memory chip in which the operation as for a ×8 device using I/O1 through I/O8 is selected;

FIG. 30 is an explanatory view depicting an address input state based on address input cycles employed in a flash memory chip in which the operation as for a ×16 device using I/O1 through I/O16 is selected;

DETAILED DESCRIPTION OF THE PREFFERED EMBODIMENTS

<<Flash Memory Chip>>

Figure 1:
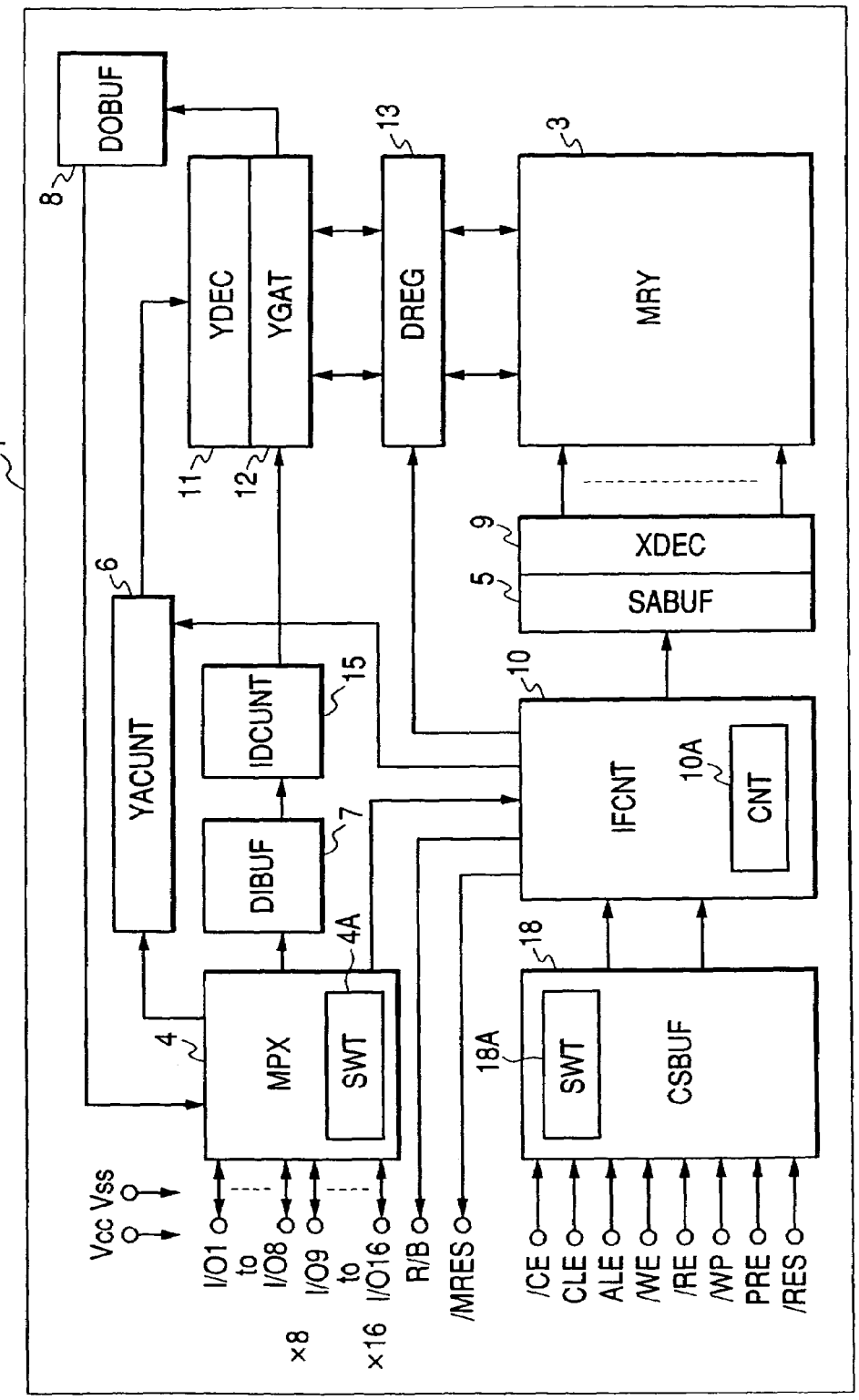
FIG. 1 is a block diagram illustrating a flash memory chip as a semiconductor memory chip of a semiconductor device according to the present invention.

A flash memory chip is illustrated in FIG. 1 as a semiconductor memory chip of a semiconductor device according to the present invention. The semiconductor memory chip 1 is formed in one semiconductor substrate such as monocrystalline silicon.

Designated at numeral 3 is a memory array (MRY), which has a memory mat and a sense latch circuit. The memory array 3 includes a large number of electrically erasable and programmable non-volatile memory cell transistors. Although not shown in the drawing in particular, each of the memory cell transistors is capable of adopting a stacked gate structure wherein a control gate is superimposed on a floating gate with an insulating film interposed therebetween, or a suitable memory cell structure such as a split gate structure wherein a selection transistor and a memory transistor having a silicon nitride film are arranged in series. In the case of, for example, a non-volatile memory cell transistor having the stacked gate structure, the control gate thereof is connected to a word line, the drain thereof is connected to a bit line, and the source thereof is connected to a source line. Although not restricted in particular, an erase operation effected on the non-volatile memory cell transistor of the stacked gate structure is set as the operation of applying a high voltage to the control gate to move electrons of the floating gate in their emission direction, thereby reducing its threshold voltage. Although not restricted in particular, a write operation effected on the non-volatile memory cell transistor of the stacked gate structure is set as the operation of applying a high voltage to its drain to inject electrons in its floating gate, thereby raising its threshold voltage. A read operation is set as the operation of detecting a change in current flowing through a bit line or a change in level of the bit line when a memory cell transistor is selected with a predetermined voltage between the low threshold voltage based on the erase operation and the high threshold voltage based on the write operation as a word line select level thereby to read memory information.

External input/output terminals I/O1 through I/O16 are shared for an address input terminal, a data input terminal, a data output terminal and a command input terminal and connected to a multiplexer 4. Sector addresses inputted to the external input/output terminals I/O1 through I/O16 are inputted to a sector address buffer (SABUF) 5 from the multiplexer (MPX) 4. A Y address (column address) is preset to a Y address counter (YACUNT) 6 from the multiplexer 4. Write data inputted to the external input/output terminals I/O1 through I/O16 are supplied from the multiplexer 4 to a data input buffer 7 (DIBUF). Read data outputted from a data output buffer (DOBUF) 8 is outputted from each of the external input/output terminals I/O1 through I/O16 via the multiplexer 4.

Some of command codes and address signals supplied to the external input/output terminals I/O1 through I/O16 are supplied from the multiplexer 4 to an internal control circuit (IPCNT) 10.

Each of the sector addresses supplied to the sector address buffer 5 is decoded by an X decoder (XDEC) 9. A corresponding word line is selected from the memory array 3 in accordance with the result of decoding thereby. Although not restricted in particular, the Y address counter 6 to which the Y address is preset, is configured as an 11-bit counter, which performs address counting with a preset value as a starting point and causes a Y decoder (YDEC) 11 to sequentially output a signal for selecting a Y gate (YGAT) 12. The Y gate 12 makes a 2048-byte data register (DREG) 13 conductive to a byte output of an input data controller (IDCNT) 15 or a byte input of the data output buffer 8 in byte units. When, for example, an address in the middle of a sector is preset to the Y address counter 6, sector data read into the data register 13 are sequentially supplied from the Y gate 12 to the data output buffer 8 in byte units with a leading address thereof as a starting point upon a data output operation. Upon a data input operation, the data supplied from the input data buffer 7 to the input data controller 15 is latched in the data register 13 from the Y gate 12 in byte units with its leading address as a starting point.

A control signal buffer (CSBUF) 18 is supplied with a chip enable signal /CE, a command latch enable signal CLE, an address latch enable signal ALE, a write enable signal /WE, a read enable signal /RE, a write protect signal /WP, a power-on-read enable signal PRE, and a reset signal /RES as access control signals supplied from outside. Symbols "/" marked on the heads of the signals mean that the signals are low enable.

The chip enable signal /CE is a signal which selects a flash memory chip 1 and which brings the flash memory chip (device) 1 active at a low level and brings it into a standby state at a high level. The read enable signal REb controls timing provided to output the data from the external input/output terminals I/O1 through I/O16. The data are read in sync with a clock change of the signal. The write enable signal /WE gives instructions for causing the flash memory chip 1 to fetch the commands, addresses and data therein on the rising edge thereof. The command latch enable signal CLE is a signal which specifies the data supplied to the external input/output terminals I/O1 through I/O16 from outside as command data. The command latch enable signal CLE is taken or fetched in sync with the rising edge of the write enable signal /WE when the data of the output terminals I/O1 through I/O16 are placed in a state of CLE="H" (high level), and is recognized as a command. The address latch enable signal ALE is a signal which designates the data supplied to the external input/output terminals I/O1 through I/O16 from outside as addresses. The address latch enable signal ALE is taken or fetched in sync with the rising edge of the write enable signal /WE when the data of the output terminals I/O1 through I/O16 are placed in a state of ALE="H" (high level), and is recognized as an address. The write protect signal /WP inhibits erasure and writing of the flash memory chip 1 in accordance with a low level. The power-on-read enable signal PRE is brought to enable when a power-on-read function for reading data of a predetermined sector without inputting commands and addresses after power-on is used. The reset signal /RES instructs the flash memory chip 1 to perform an initializing operation in accordance with a transition from a low level to a high level after power-on.

The respective operation modes of the address input, command input and data input/output operations of the flash memory chip 1, which are instructed by the access control signals, are represented as shown in FIG. 2 if they are shown in order.

The internal control circuit 10 performs interface control in accordance with the operation modes shown in FIG. 2 and controls internal operations such as erasure, writing and reading, etc. in accordance with command codes. The definition of commands supported by the flash memory chip 1 is illustrated in FIG. 3. The internal control circuit 10 outputs a read/busy signal R/B and a master reset signal /MRES. During the operation of the flash memory chip 1, the ready/busy signal R/B notifies a busy state to the outside in accordance with its low level. The master reset signal /MRES is a signal usable as a reset signal for an external CPU (Central Processing Unit) or a flash memory controller upon the use of the power-on-read function, and notifies that the output of read data based on power-on-read to the outside is enabled based on a change thereof from a low level to a high level. The read data based on power-on-read can be provided for convenience where CPU or the like uses it as initialization data.

Figure 4:
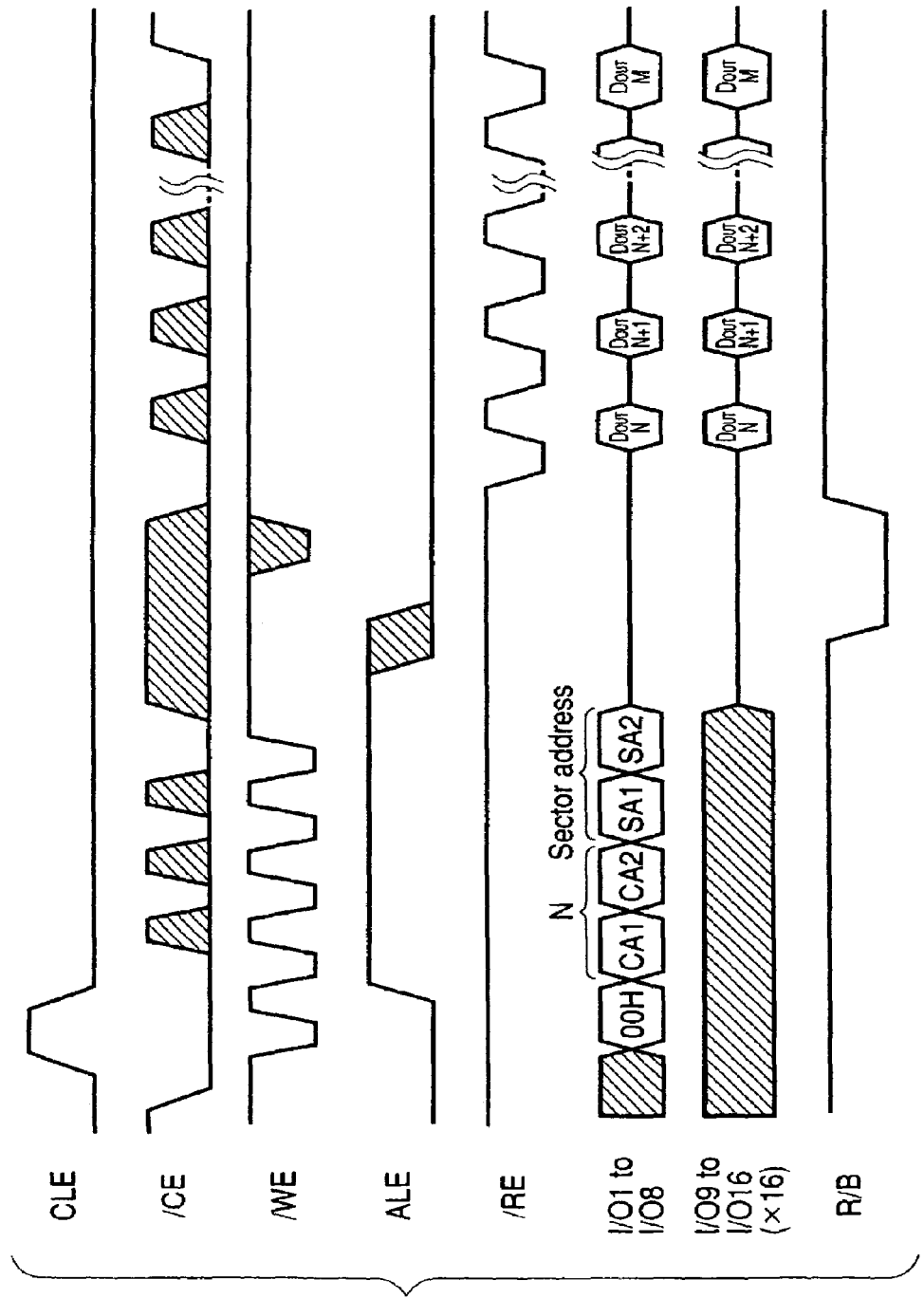
FIG. 4 is a timing chart illustrating a read operation cycle based on control of an internal control circuit.

A read operation cycle based on control of the internal control circuit 10 is illustrated in FIG. 4. A read mode command "00H" is inputted in a command input mode. Subsequently, column addresses CA1 and CA2 are inputted in an address input mode, and sector addresses SA1 and SA2 are inputted. In accordance with the input sector addresses SA1 and SA2, data corresponding to their sectors are internally transferred from the memory array 3 to the data register 13. The transferred data are selected by the Y gate 12 with a column address as a starting point, and the read data are sequentially outputted from the output terminals I/O1 through I/O16 in sync with a change in the clock of the read enable signal REb.

<<Switching of Interface Functions by Bonding Options>>

A description will be made of switching between interface functions by bonging options included in the flash memory chip 1. This switching function is realized by, for example, a switching circuit included in the multiplexer 4 or the control signal buffer 18. The switching circuit performs switching between interface functions of predetermined second bonding pads in accordance with the state of a potential applied to a first bonding pad, by a bonding option. Several types of switching modes will first be explained.

<<Switching Mode of Interface Function>>

Modes for switching between interface functions of bonding pads employed in the flash memory chip 1 are illustrated in each of FIGS. 5 and 6. Eleven modes are illustrated in the same drawings respectively. The respective modes are shown across FIGS. 5 and 6 in accordance with the relationship with the size of the drawings. Numbers of bonding pads are shown up to Numbers 1 through 63 as PAD#. Numbers up to PAD#1 through PAD#30 are arranged in a row along the long side on the left side of the flash memory chip 1. Numbers up to PAD#31 through PAD#63 are arranged in a row along the long side on the right side of the flash memory chip 1. Bonding pads (bonding option pads) used in the bonding option are defined as B.O.NAND of PAD#11, B.O.1.8 of PAD#13, B.O.STD of PAD#15, PROBE of PAD#17, B.O.MIR of PAD#34, B.O.X8 of PAD#45, B.O.1.8 of PAD#47, B.O.AdU of PAD#59, and B.O.CE1 of PAD#61. Functions of bonding option pads and their setting methods are shown at sight in FIG. 7. The bonding option B.O.1.8 determines that an operating power supply of an external interface circuit should be set to 3.3V or 1.8V. The B.O.CE determines that /CE1 should be made valid or /CE2 should be made valid. The B.O.X8 determines that I/O should be used in either 16-bit parallel or 8-bit parallel. The B.O.NAND determines whether an ECC function and a ware levelling function should be supported by the flash memory chip (super-AND) or not (NAND). The details of setting of other functions by bonding option pads will be explained below.

In FIGS. 5 and 6, the second bonding pads intended for switching of the interface functions are defined as electrodes for plural-bit parallel input/output, which are indicated by I/O1 through I/O16, and control signal input bonding pads typified by /RE, /CE, etc. Bonding pads for supplying power, which are typified by VCC, VSS, etc. are excepted from ones intended for switching of the interface functions. A switch and a logic gate are used for switching of each interface function. Since the switch or the like needs an extremely large current supply capacity for the purpose of switching of power supply bonding pads, it is not realistic that the power supply bonding pads are intended for switching of the interface functions. In FIGS. 5 and 6, the functions of the bonding pads for the power supply voltage VCC, power supply voltage VCCQ (power supply voltage for external input/output interface) and circuit's ground voltage VSS remain unchanged in any mode. In the marking of FIGS. 5 and 6, the bonding pads for signals surrounded by double frames mean bonding pads available for interface functions at that time. Other bonding pads mean that they are not available for the interface functions.

The modes shown in FIGS. 5 and 6 are respectively defined as MMC, NAND16, NAND8, CORE16 (MCP-A), CORE16 (MCP-B), CORE8 (MCP-A), CORE8 (MCP-B), MIRROR16 (MCP-A), MIRROR16 (MPC-B), MIRROR8 (MCP-A) and MIRROR8 (MCP-B).

Figure 8:
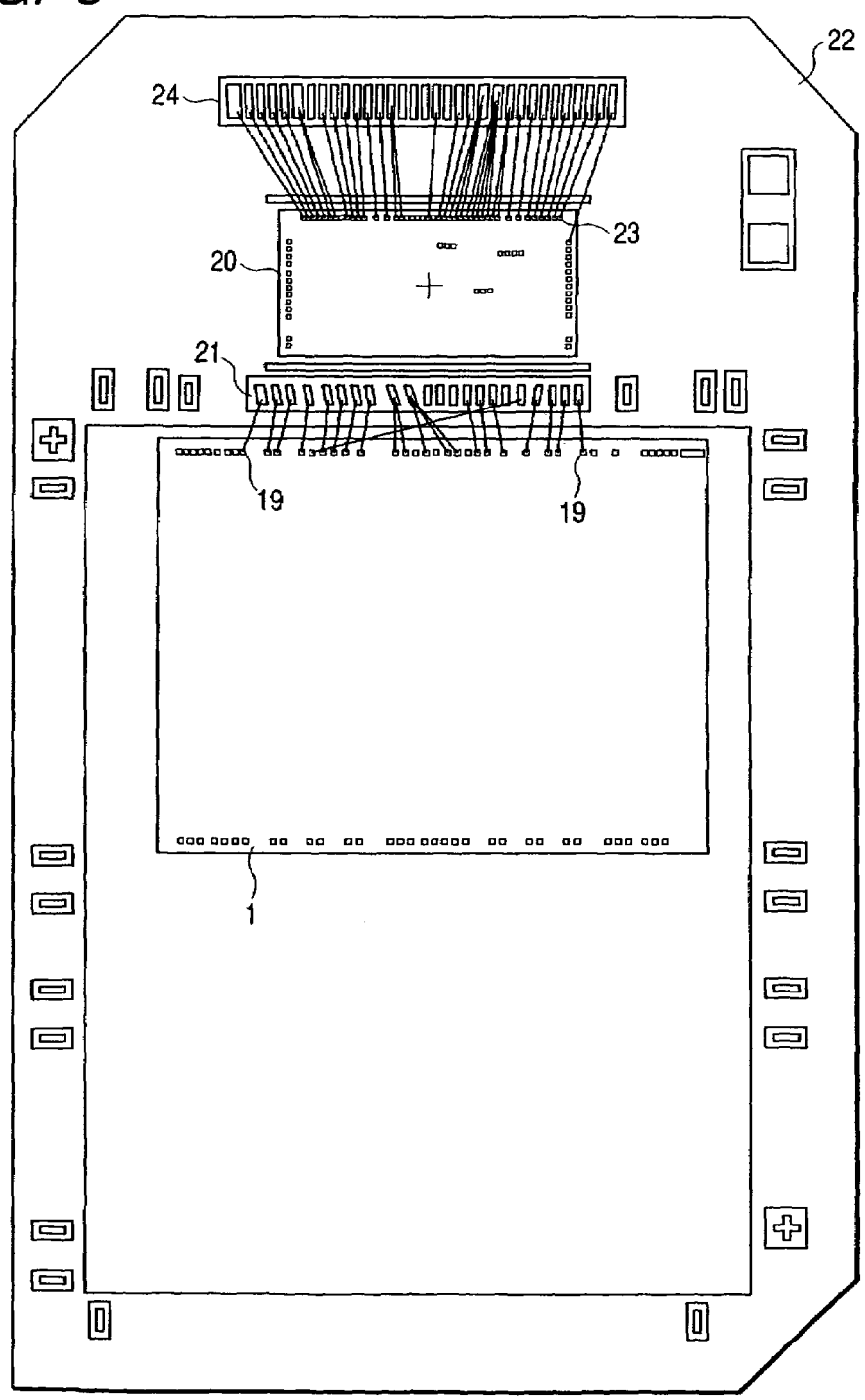
FIG. 8 is a plan view illustrating a state in which a flash memory chip is mounted in a multimediacard in an MMC mode.

The MMC mode is of a mode which provides optimization for mounting to a MultiMediaCard (MultiMediaCard is of the registered trademark of InfineonTechnologiesAG. This is abbreviated as "Multimediacard"). With the connection of the PROBE of PAD#17 to the bonding pad of the ground potential VSS, bonding pads on one side as viewed on the left side of the chip are made available. Although the power supply pads lying on the right side are always available as mentioned above, there is no need to actually make use of them at this time. This is because the required number of power supply pads is disposed on the left and right sides respectively. A state in which a flash memory chip 1 is mounted on a multimediacard in the MMC mode, is illustrated in FIG. 8. Reference numeral 20 indicates a controller chip which access-controls the flash memory chip 1. Of bonding pads of the flash memory chip 1, the bonding pads 19 disposed on the one-sided left side, which make the interface functions valid, are wire-bonded to their corresponding bonding pads 21 lying over a substrate 22 of a memory card. The bonding pads 21 are connected to their corresponding memory interface terminals of the controller chip 20 via unillustrated wirings lying over the memory card substrate 22. External interface bonding pads 23 of the controller chip 20 are wire-bonded to their corresponding external interface terminals 24 of the memory card substrate 22. The controller chip 20 has a card host interface function based on memory card specs of the multimediacard.

Each of the NAND16 and NAND8 modes has an interface function (STANDARD) at the selection of a flash memory standard interface selected with connection of the bonding option pad B.O.STD of PAD#15 to VSS. In particular, a mode in which a 16-bit parallel interface function based on I/O1 through I/O16 is selected with the bonding option pad B.O.X8 being made open (floating), corresponds to the NAND16, whereas a mode in which a 8-bit parallel interface function based on I/O1 through I/O8 is selected with connection of the bonding option pad B.O.X8 to VCC, corresponds to the NAND8.

Each of the MCP core mode and the MCP mirror mode shown in FIGS. 5 and 6 corresponds to a form in which the flash memory chip 1 is applied to an MCP structure. As to the functions of the bonding pads, the other MCP mirror mode is disposed symmetrically with respect to one MCP core mode in such a manner that the same function terminals are placed in the same positions as viewed on the obverse and reverse sides when the reverse side is butted against the obverse side. For instance, the CORE16 (MCP-A) mode and the MIRROR16 (MCP-A) mode correspond to each other. In a bonding array lying on the right side of the chip in FIG. 6, the arrangements of I/O1 through I/O16 are disposed linearly symmetrically with respect to the boundary between PAD#46 and PAD#47. In a bonding array lying on the left side of the chip in FIG. 5, the arrangements of CLE, /WE, /WP, /CE2 and ALE are disposed substantially linearly symmetrical with respect to the boundary between PAD#14 and PAD#15. The difference between the modes CORE16 and CORE8 resides in that the 16-bit parallel interface function based on I/O1 through I/O16 should be used or the 8-bit parallel interface function based on I/O1 through I/O8 should be used. The difference between the modes MCP-A and MCP-B resides in that either /CE1 or /CE2 should be used for chip enable. Incidentally, Vmoni1 through Vmoni4 are test-dedicated pads in the respective drawings and not intended for bonding.

Figure 9:
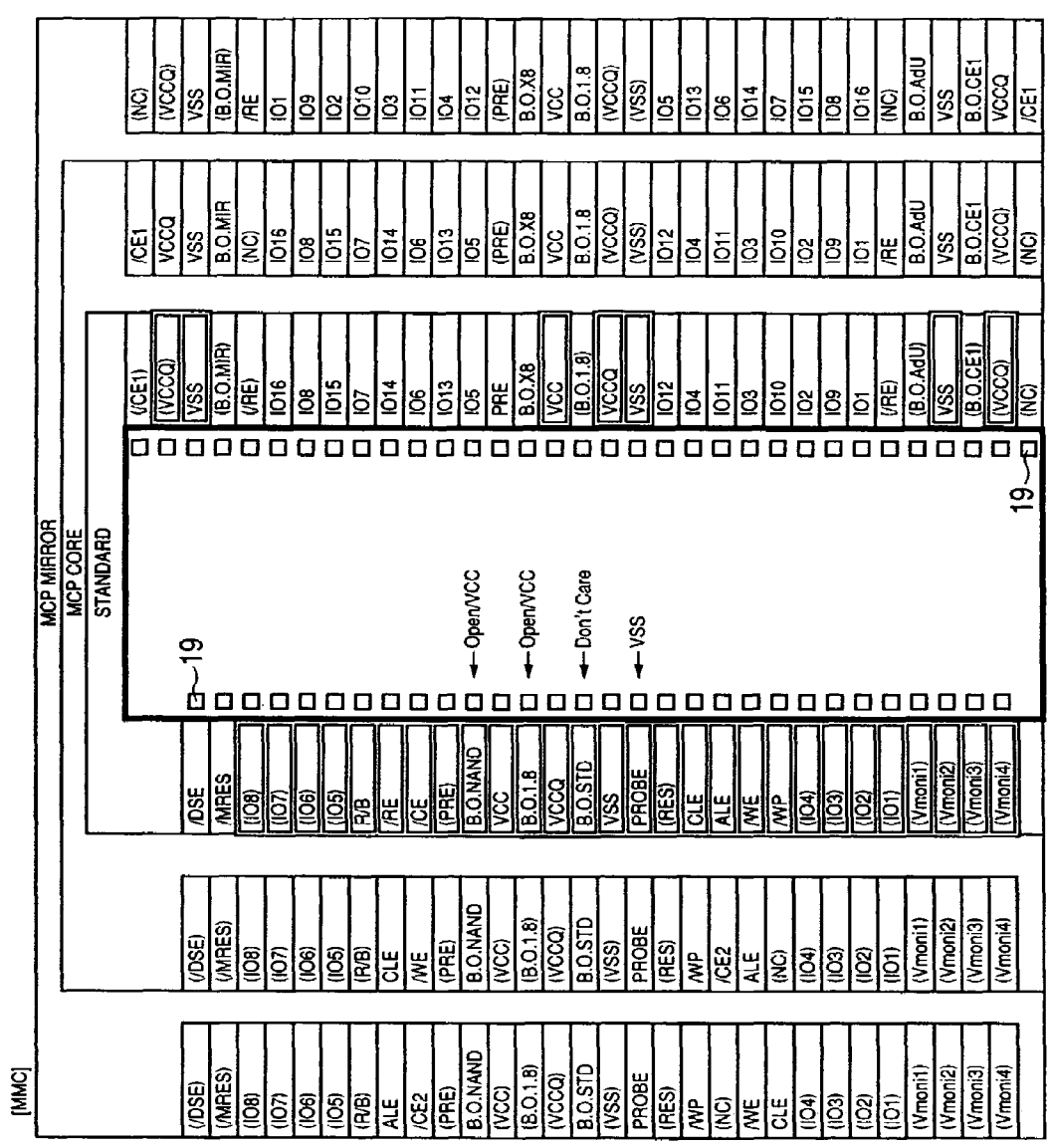
FIG. 9 is an explanatory view showing interface functions of bonding pads in the MMC mode and a state of setting of bonding option pads thereof.
Figure 10:
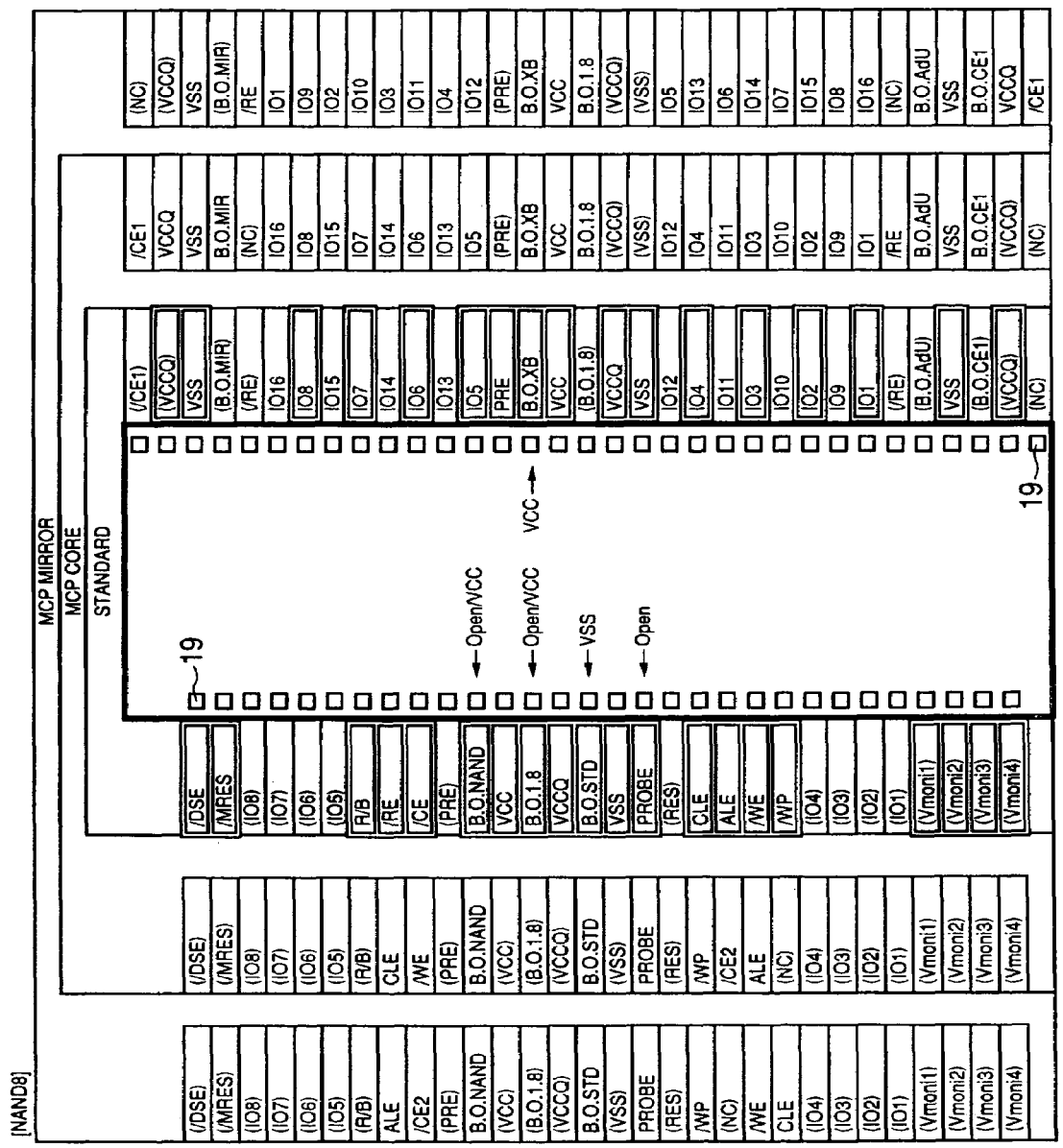
FIG. 10 is an explanatory view showing interface functions of bonding pads associated with a NAND8 form corresponding to the mode of standard, and a state of setting of bonding option pads thereof.
Figure 11:
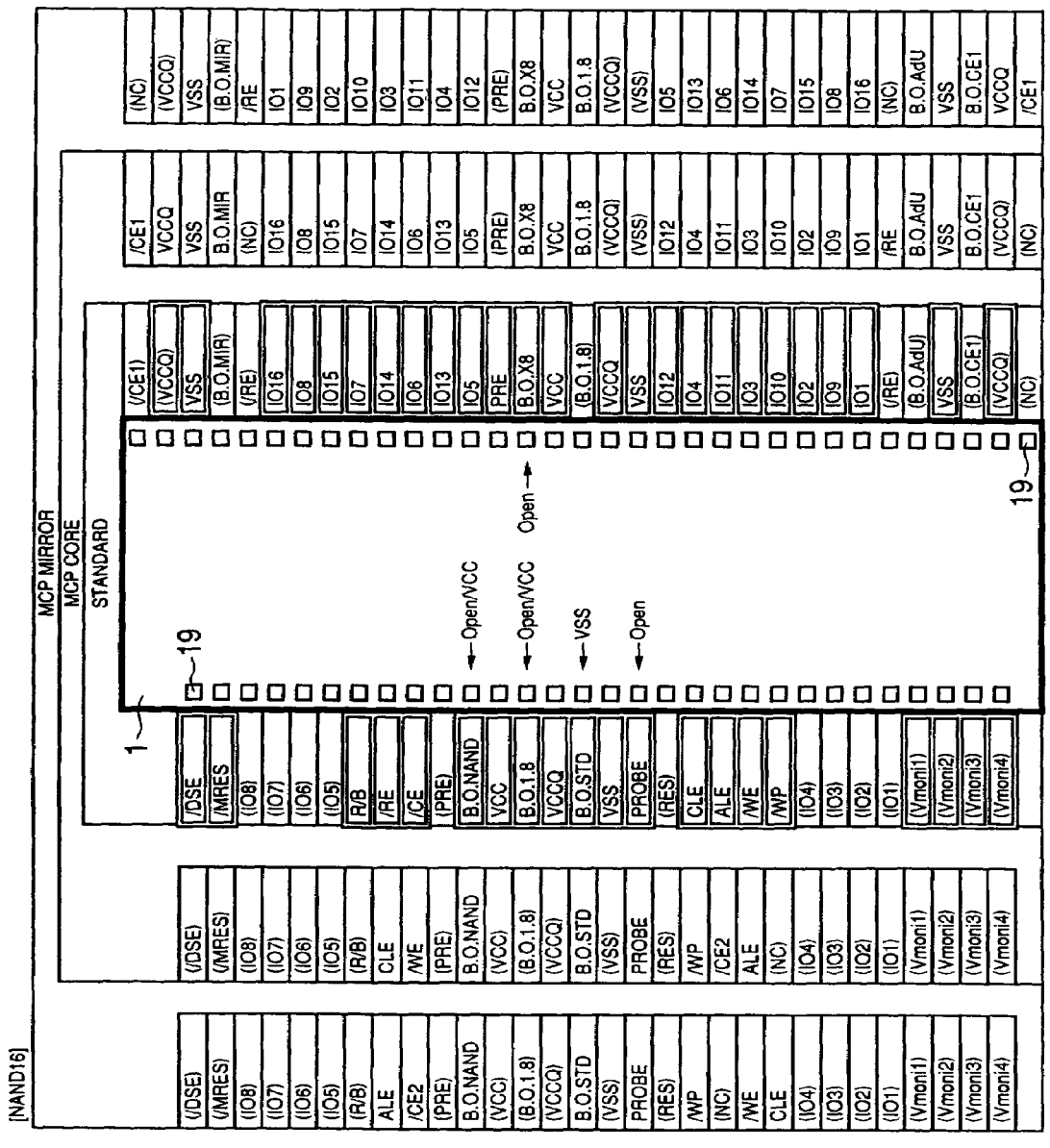
FIG. 11 is an explanatory view depicting interface functions of bonding pads associated with a NAND16 form corresponding to the mode of standard, and a state of setting of bonding option pads thereof.
Figure 12:
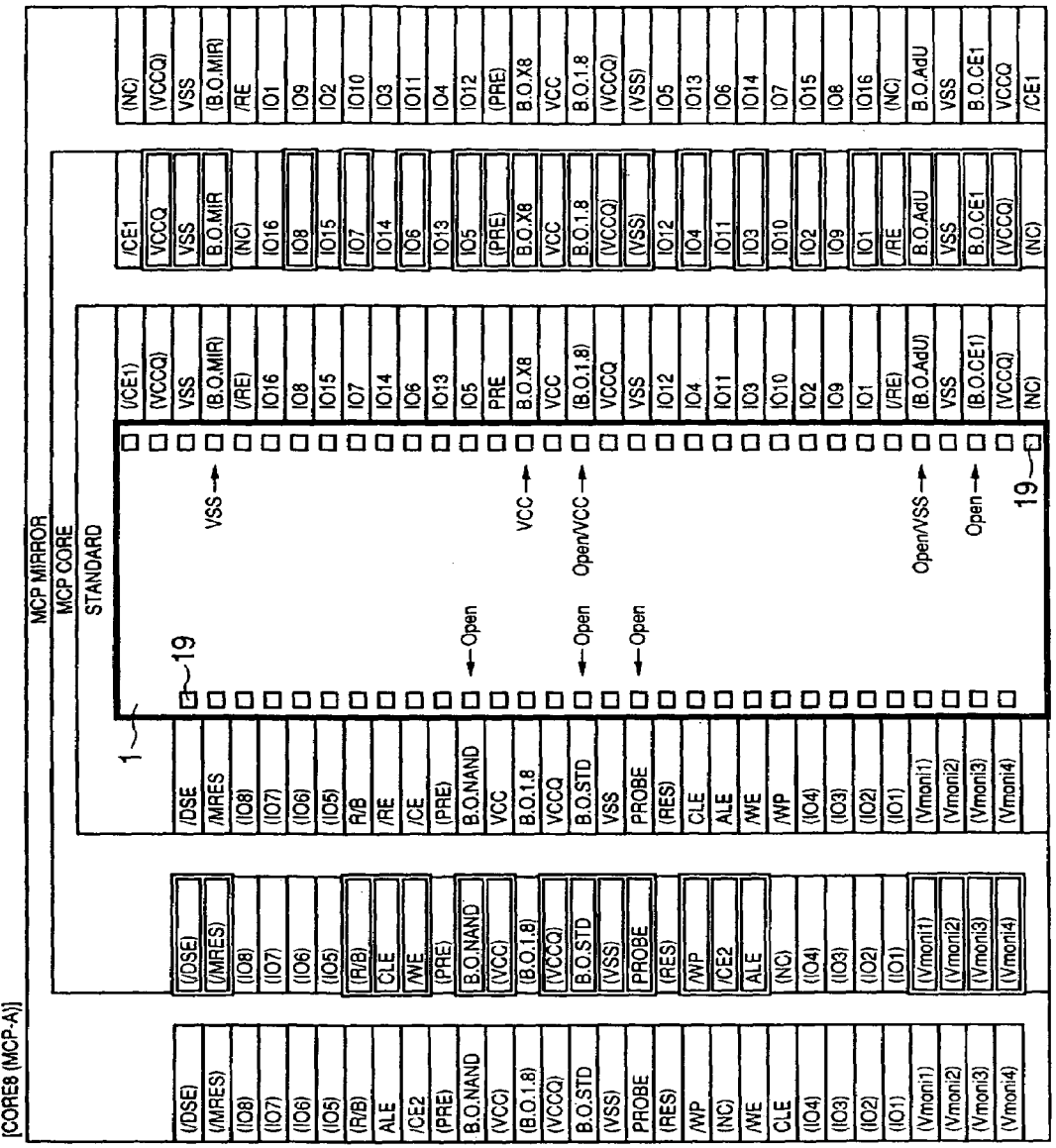
FIG. 12 is an explanatory view showing interface functions of bonding pads associated with a 8-bit MCP core form of MCP-A, and a state of setting of bonding option pads thereof.
Figure 13:
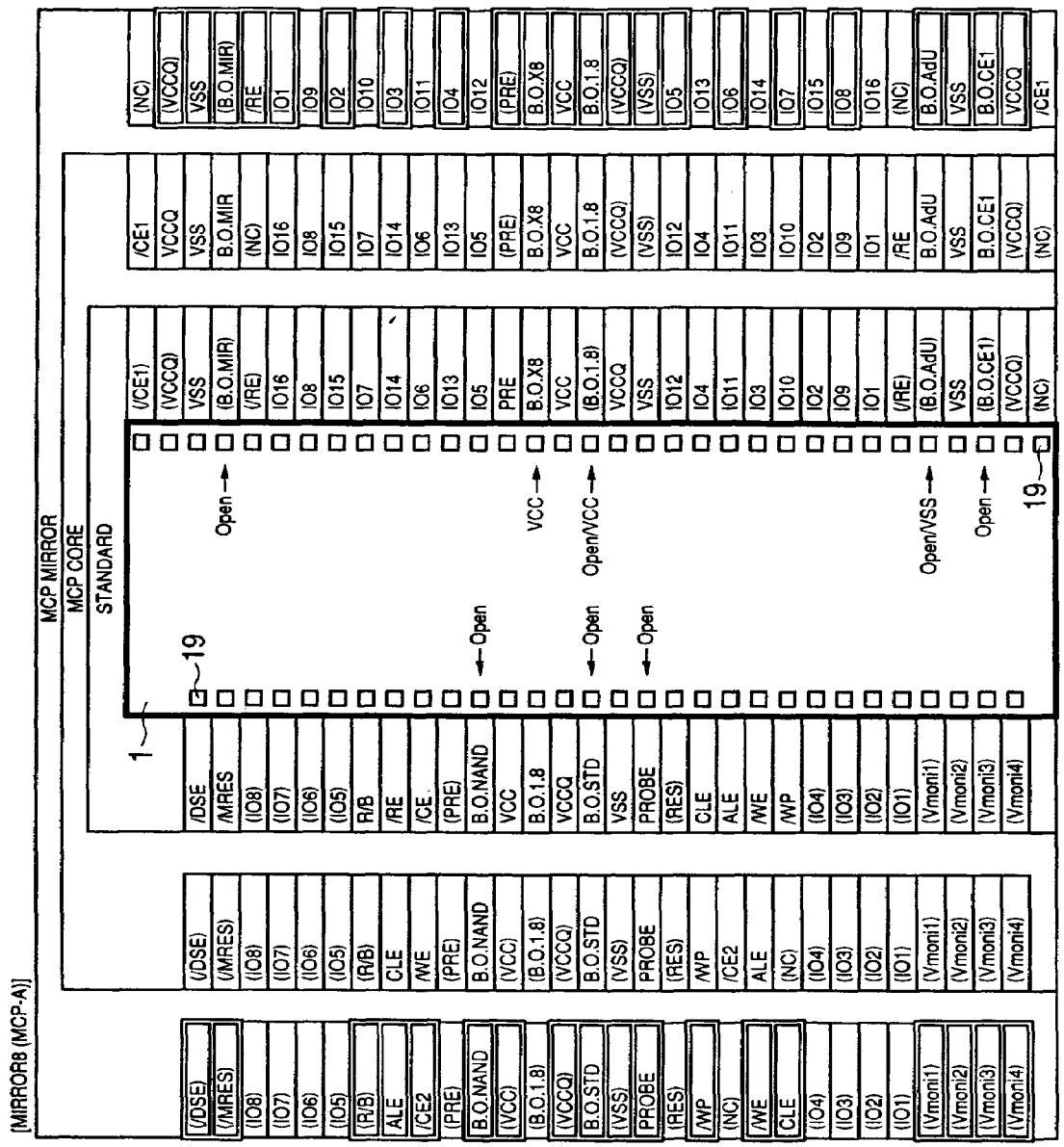
FIG. 13 is an explanatory view depicting interface functions of bonding pads associated with a 8-bit MCP mirror form of MCP-A, and a state of setting of bonding option pads thereof.
Figure 14:
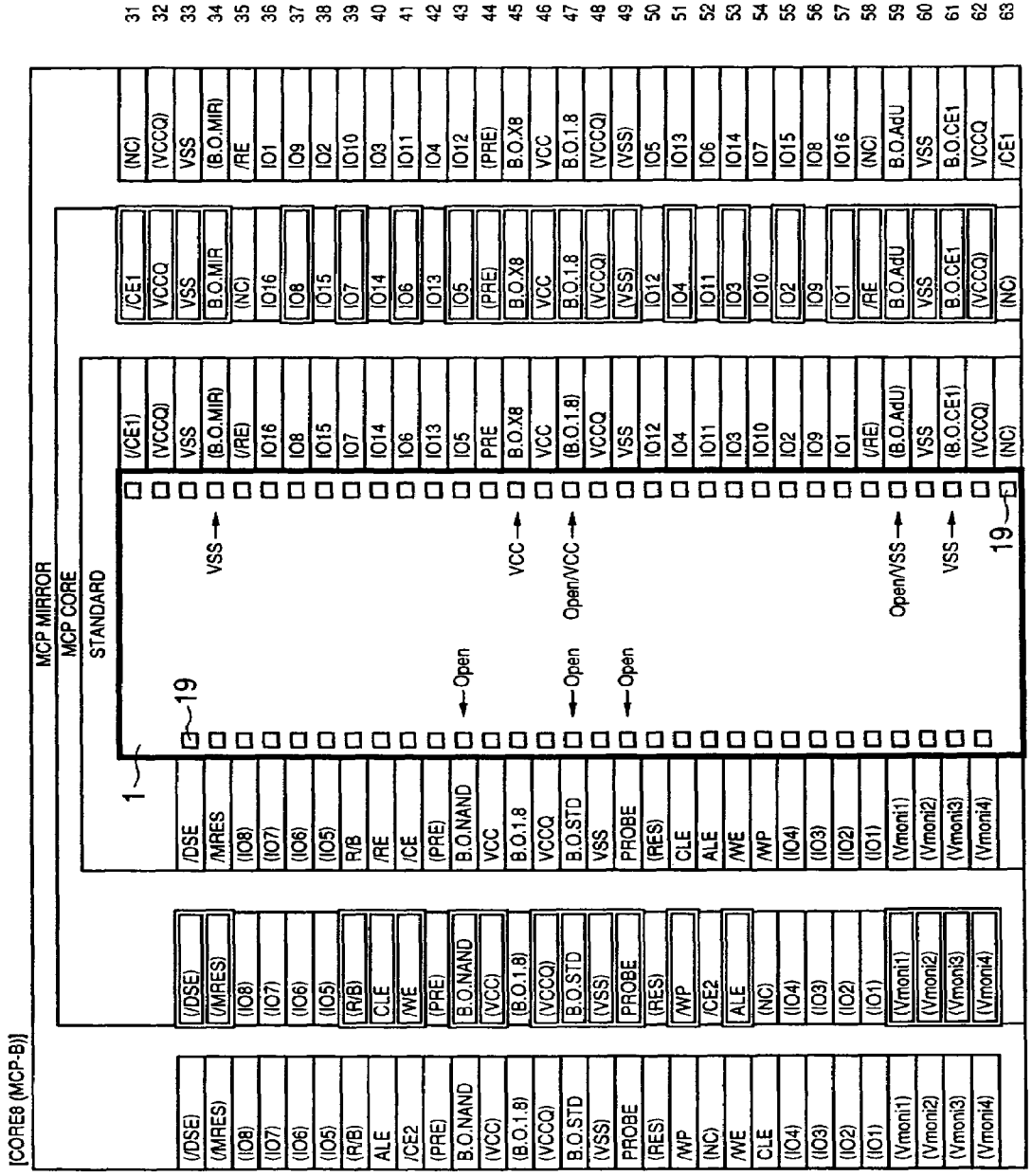
FIG. 14 is an explanatory view showing interface functions of bonding pads associated with a 8-bit MCP core form of MCP-B, and a state of setting of bonding option pads thereof.
Figure 15:
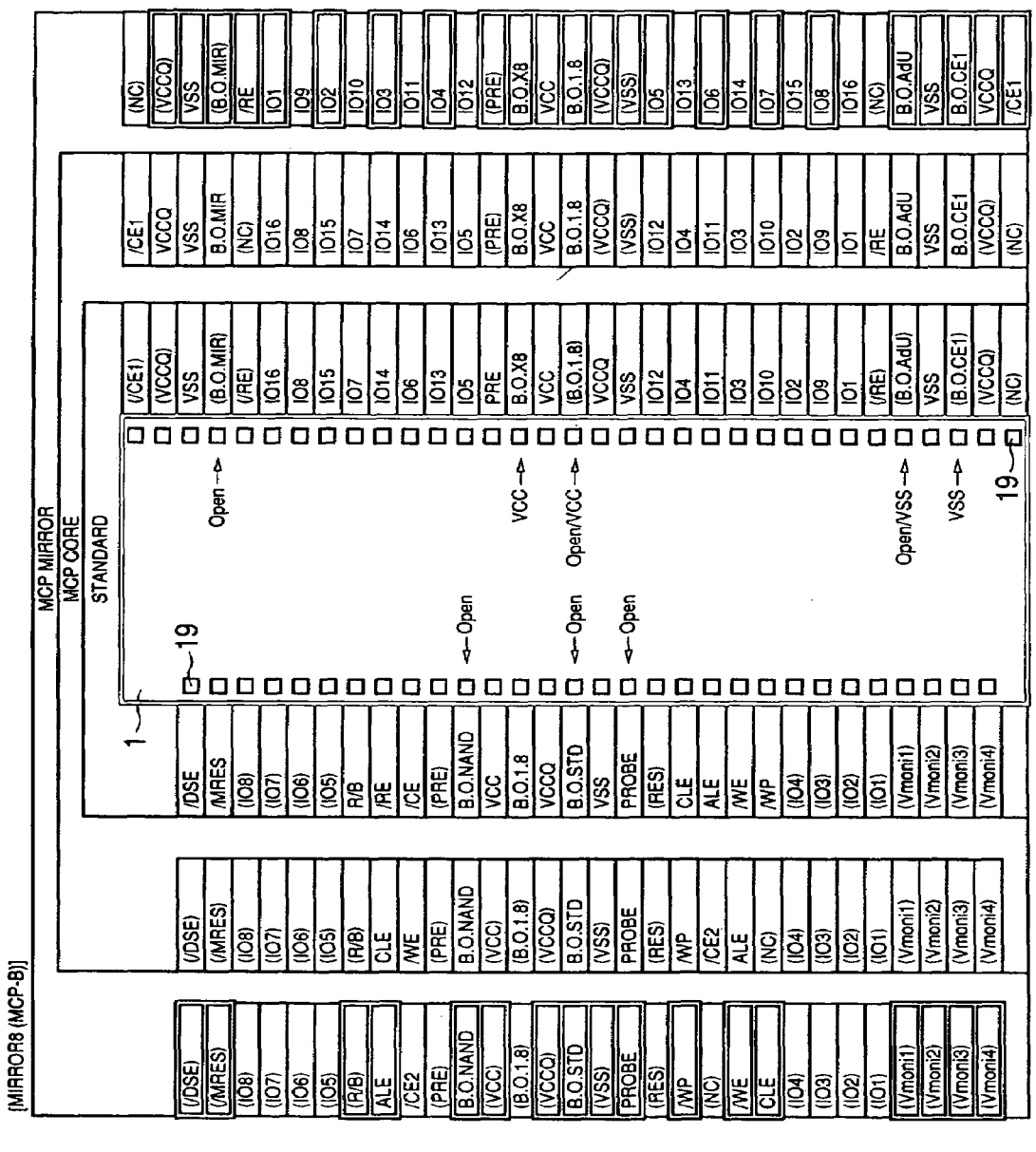
FIG. 15 is an explanatory view depicting interface functions of bonding pads associated with a 8-bit MCP mirror form of MCP-B, and a state of setting of bonding option pads thereof.
Figure 16:
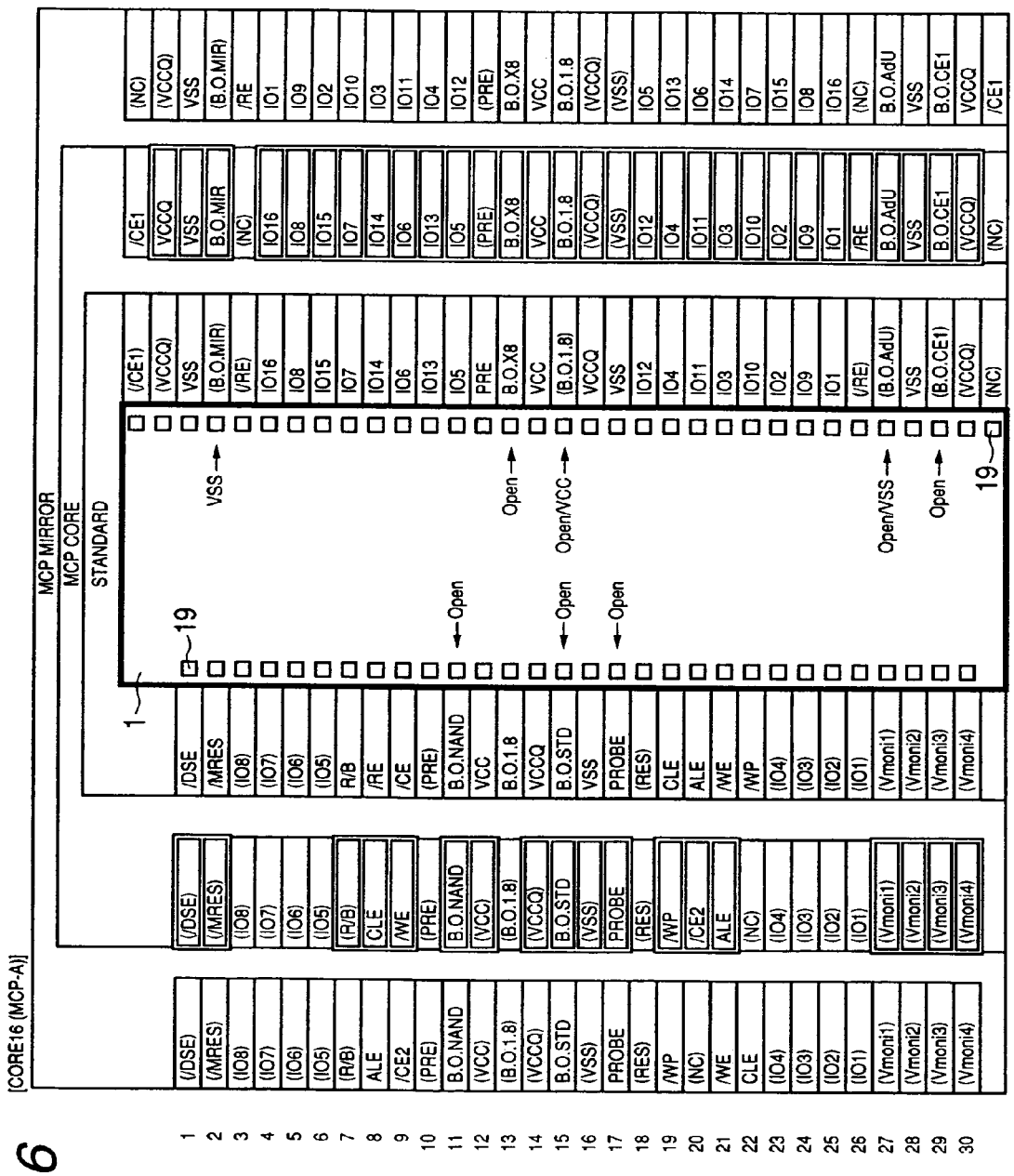
FIG. 16 is an explanatory view showing interface functions of bonding pads associated with a 16-bit MCP core form of MCP-A, and a state of setting of bonding option pads thereof.
Figure 17:
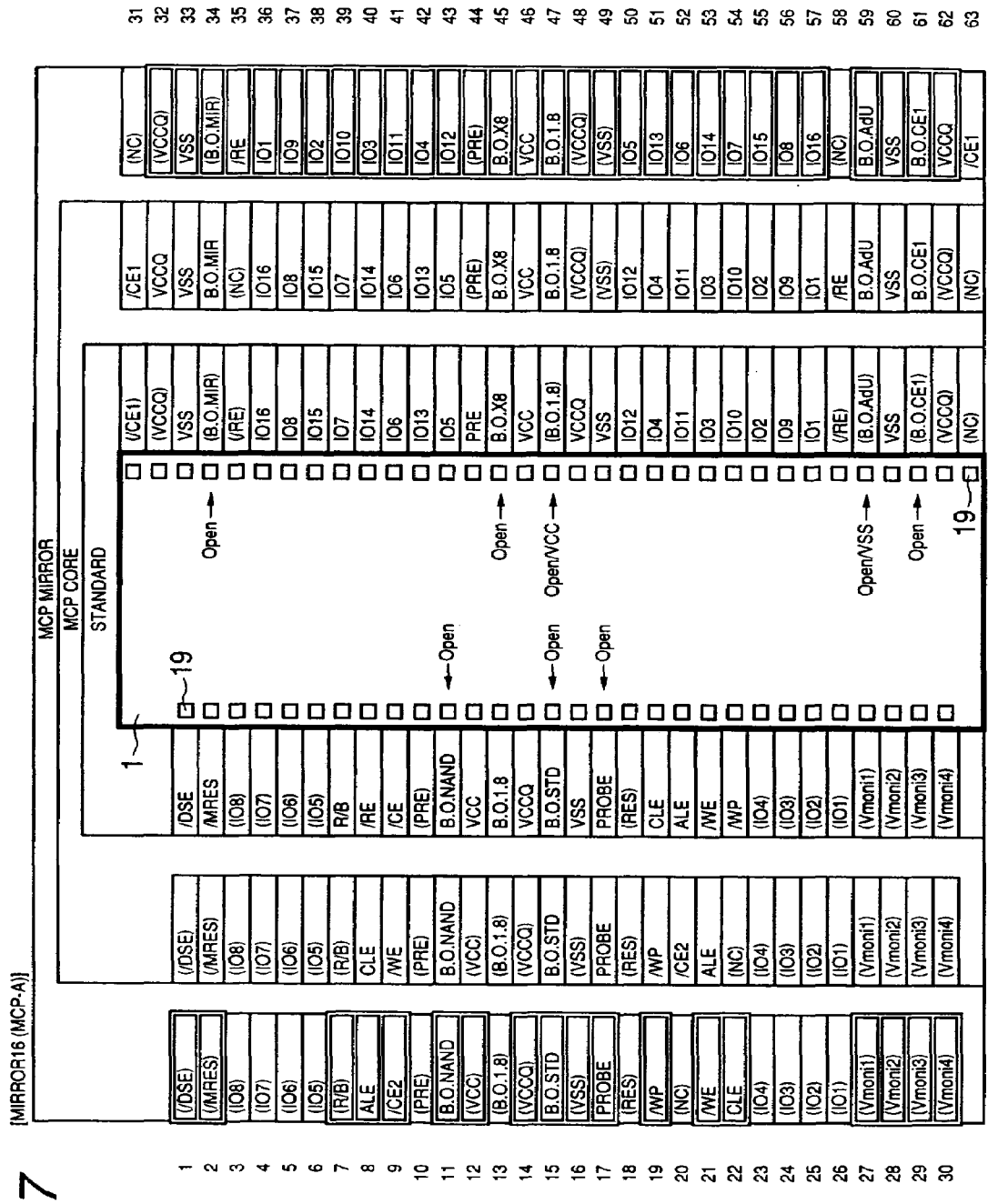
FIG. 17 is an explanatory view depicting interface functions of bonding pads associated with a 16-bit MCP mirror form of MCP-A, and a state of setting of bonding option pads thereof.
Figure 18:
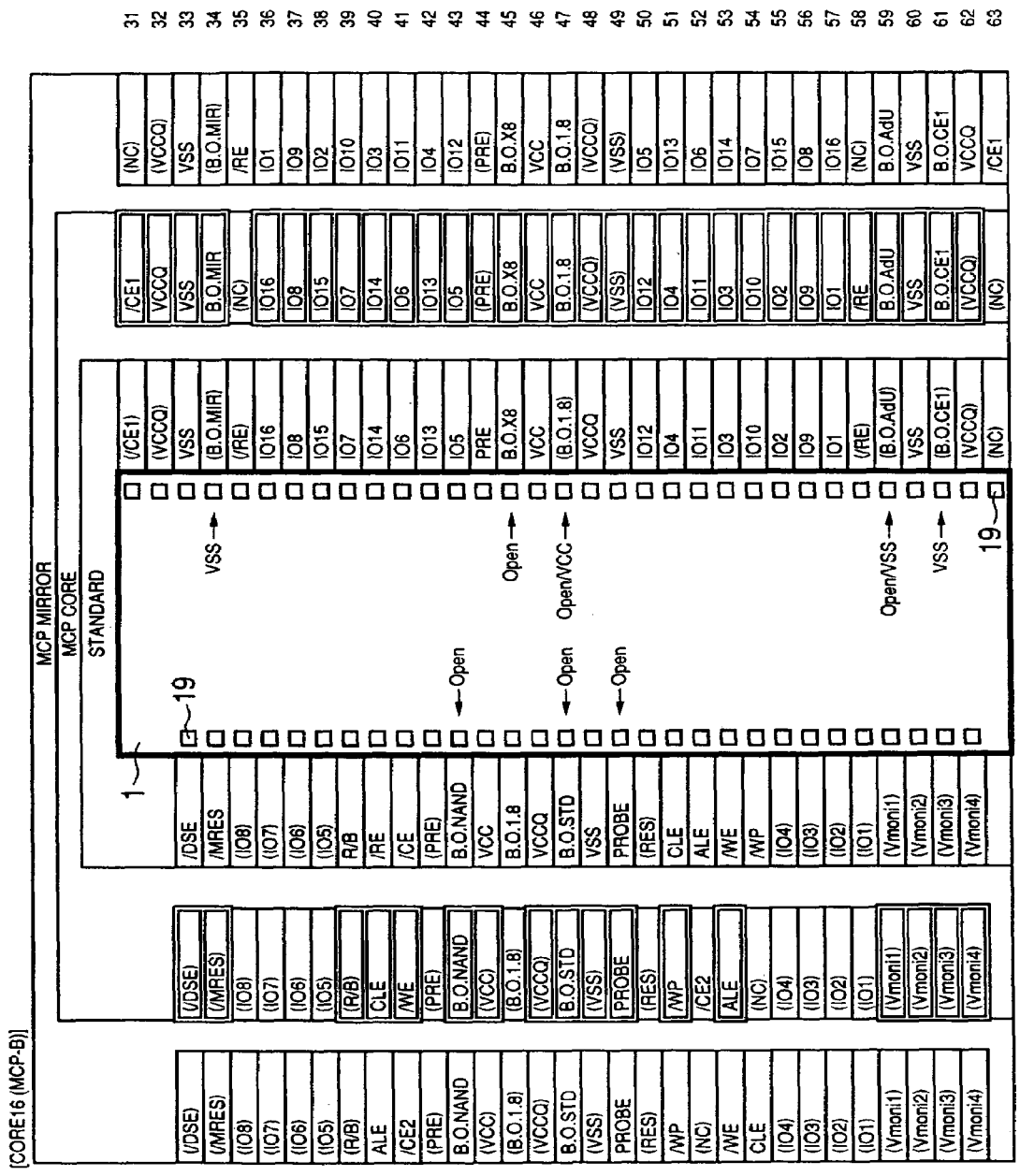
FIG. 18 is an explanatory view showing interface functions of bonding pads associated with a 16-bit MCP core form of MCP-B, and a state of setting of bonding option pads thereof.
Figure 19:
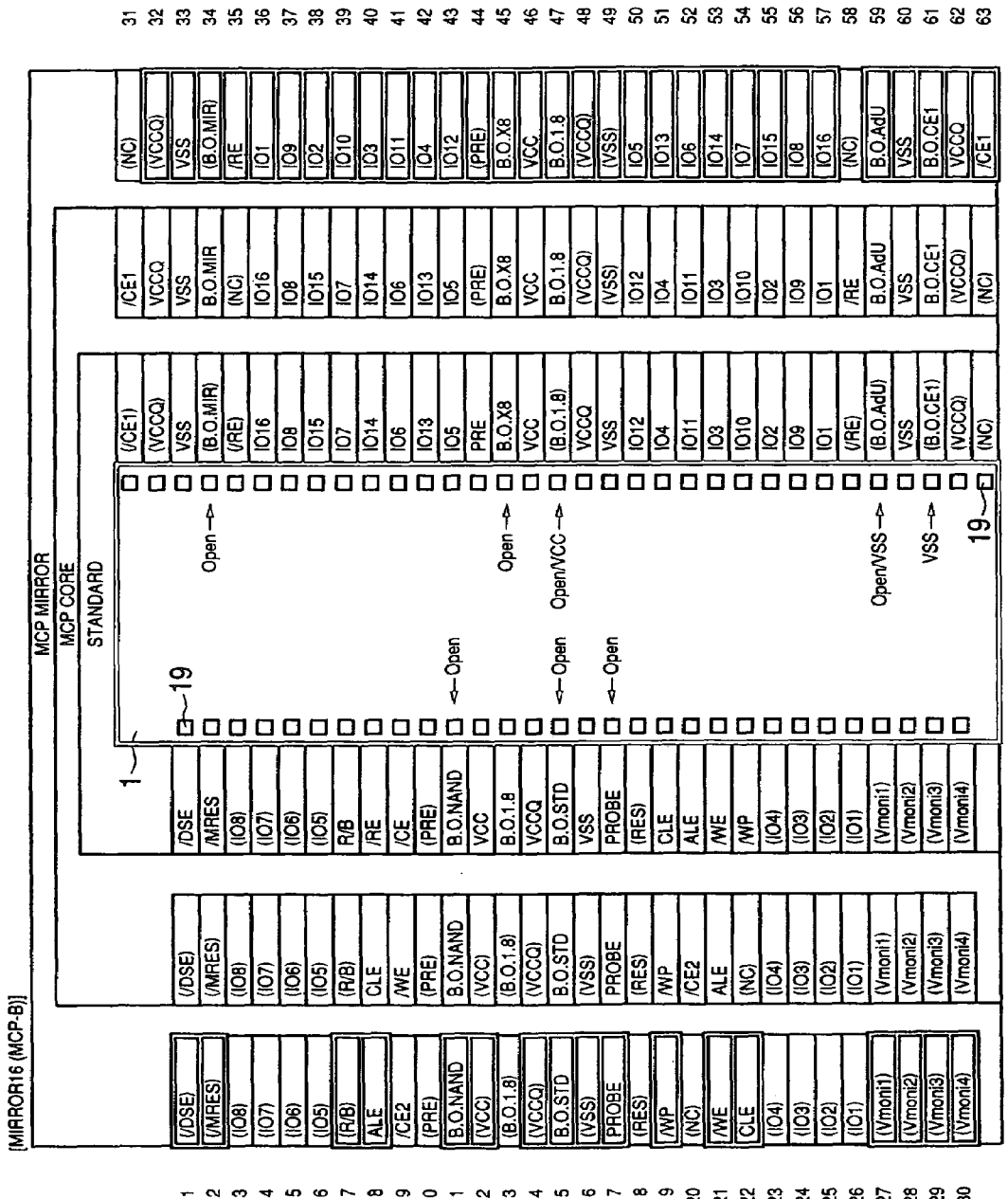
FIG. 19 is an explanatory view showing interface functions of bonding pads associated with a 16-bit MCP mirror form of MCP-B, and a state of setting of bonding option pads thereof.

Interface functions of bonding pads for the flash memory chip 1, which are selected in accordance with the switching modes shown in FIGS. 5 and 6 and states of setting of their bonding option pads are shown in FIGS. 9 through 19. Terminals with double frames attached thereto are equivalent to bonding pads available in the switching modes. FIG. 9 corresponds to the MMC mode. FIGS. 10 and 11 respectively correspond to NAND8 and NAND16 indicative of standard modes. FIGS. 12 and 13 respectively show modes for an 8-bit MCP core and an 8-bit MCP mirror of MCP-A. FIGS. 14 and 15 show modes for an 8-bit MCP core and an 8-bit MCP mirror of MCP-B. FIGS. 16 and 17 show modes for a 16-bit MCP core and a 16-bit MCP mirror of MCP-A. FIGS. 18 and 19 show modes for a 16-bit MCP core and a 16-bit MCP mirror of MCP-B.

<<Semiconductor Device of MCP Structure>>

Figure 20:
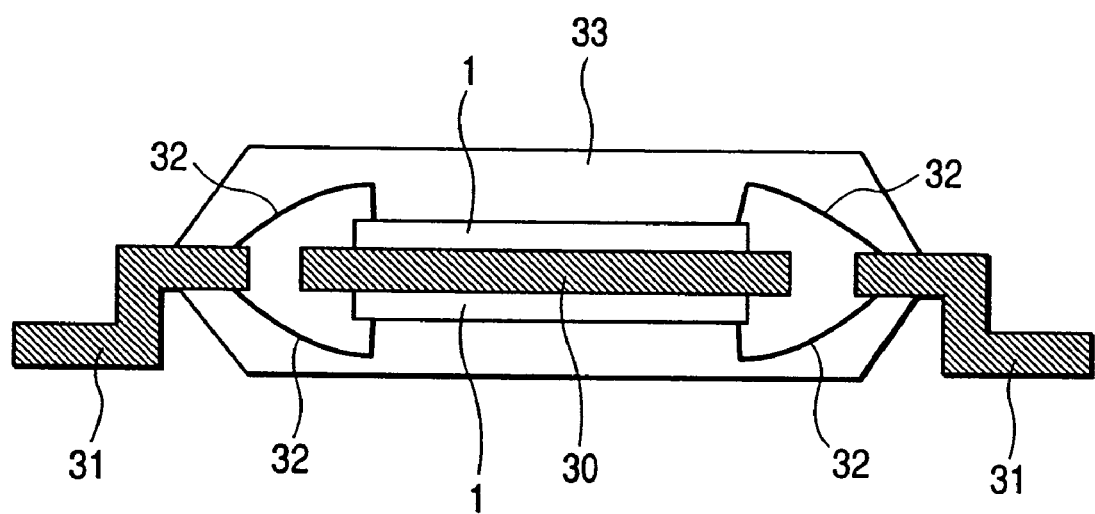
FIG. 20 is a schematic vertical cross-sectional view of a semiconductor device having an MCP structure.
Figure 21:
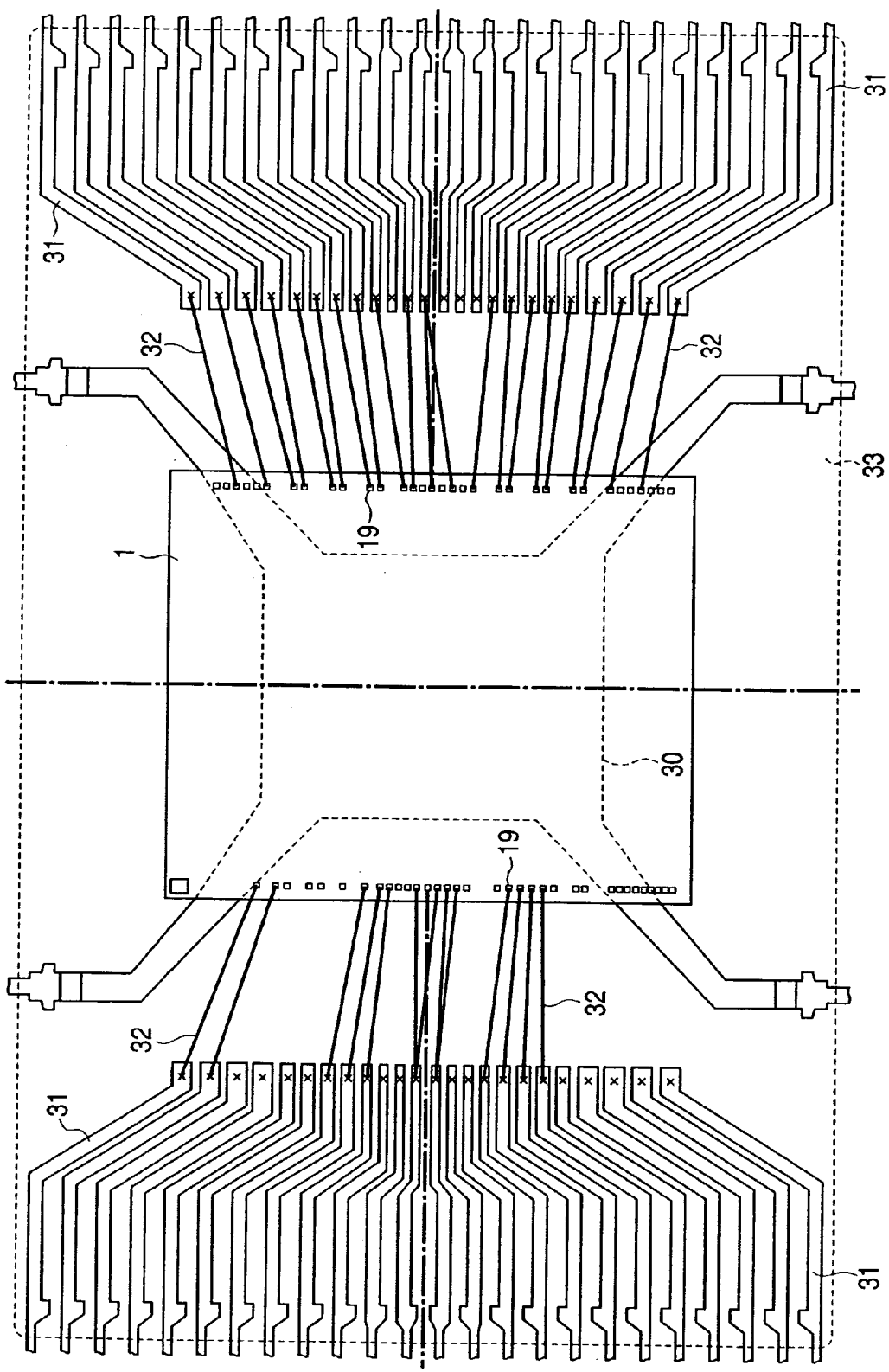
FIG. 21 is an explanatory view showing a referential example of a planar structure assembled using lead frames for TSOP.

A schematic vertical sectional view of a semiconductor device having an MCP structure is shown in FIG. 20. This is assembled using lead frames for TSOP. Flash memory chips 1 are mounted in pair with their back surfaces being placed face to face with both surfaces of an island 30. Reference numerals 31 indicate typically-illustrated lead terminals, and reference numeral 33 indicates an encapsulating or sealing resin. A referential example of a planar structure assembled using the lead frames for TSOP is shown in FIG. 21. In the referential example of FIG. 21, the numbers of the bonding pads and lead terminals are shown fewer than actual for simplification of plotting.

As mentioned above, the bonding pads intended for substitution of the interface functions have layouts substantially coincident with one another as viewed in the obverse and reverse directions in a state in which a pair of semiconductor memory chips is placed such that their back surfaces overlap each other. In other words, the bonding pads intended for substitution of the interface functions have layouts symmetrical with predetermined bonding pads of the bonding pads arranged on one side of the chip being placed as the center. Thus, when the same type of flash memory chips 1 are superimposed on each other with their back surfaces being butted against each other, the bonding pads like I/O1 through I/O16 each having the same function take the same positions as viewed on the obverse and reverse sides, and bonding wires for commonly connecting the bonding pads each having the same function to the same lead terminals can be prevented from contacting other wires. Since a package substrate with plural signal wiring layers attached thereto cannot be used like CSP in the case of a package structure with TSOP as a principal body, it is essential that paths for the bonding wires are configured so as not to intersect in plural form. Thus, when a semiconductor device of a multichip package structure using a plurality of flash memory chips 1 is realized, there is no need to align chips for mirror symmetry, which use mirror-reversed mask patterns of all wiring layers and option masks for metal wiring. Further, there is no need to impose a processing burden such as high/low-order inversion of addresses or data on access taken as principal.

Figure 22:
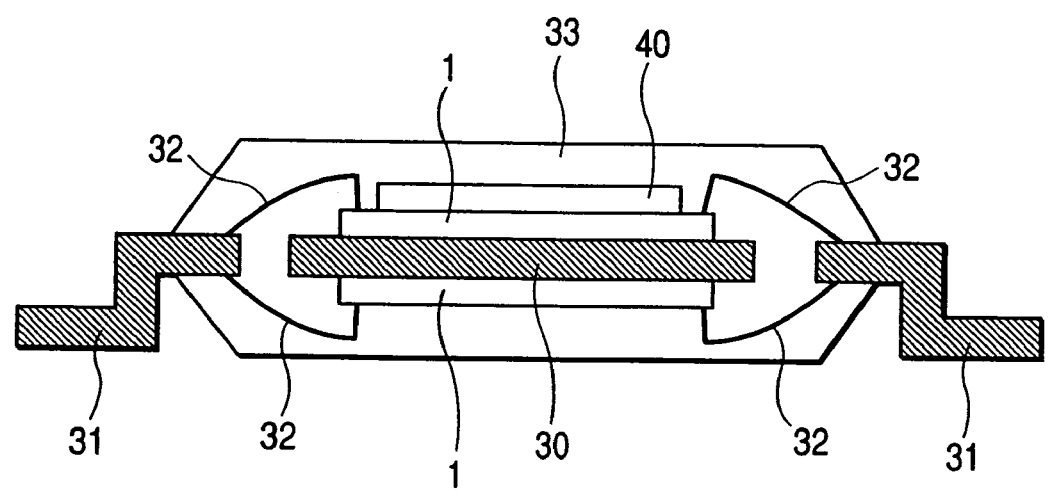
FIG. 22 is a schematic vertical cross-sectional view of another semiconductor device having an MCP structure.

A schematic vertical cross-sectional view of another semiconductor device having an MCP structure is shown in FIG. 22. A point of difference between FIG. 22 and FIG. 20 resides in that a further memory chip 40 is stacked on one flash memory chip. When the flash memory chip 1 is set as an AND type, for example, the memory chip 40 is configured as a NOR type flash memory chip. An increase in capacity by an AND type and an improvement in random access performance by a NOR type can be used properly according to the type of memory information.

<<Semiconductor Device of CSP Structure>>

Figure 23:
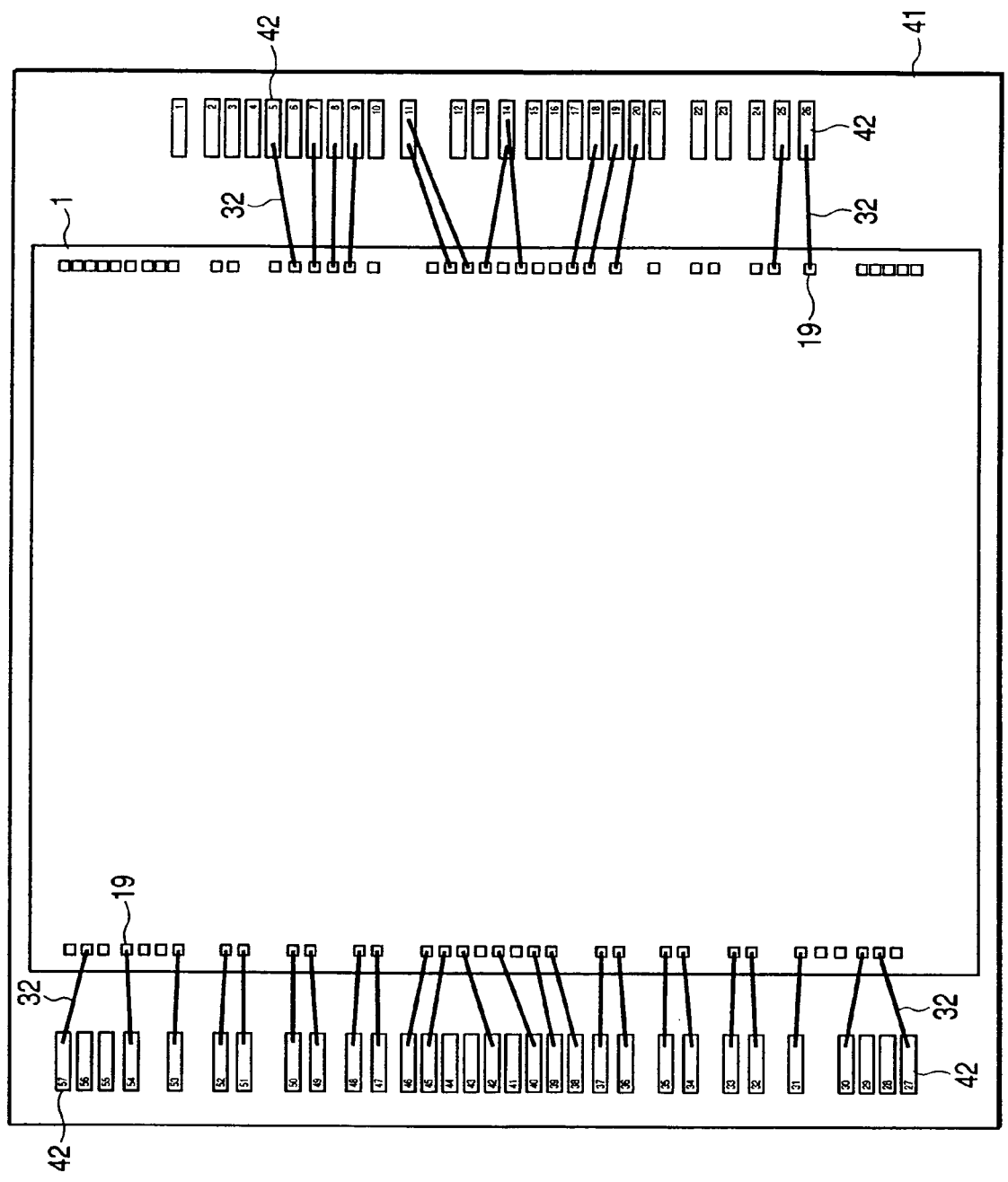
FIG. 23 is an explanatory view illustrating a planar structure of a semiconductor device at the time that a CSP structure is adopted as a structure of a package.

A planar structure of a semiconductor device at the time that a CSP structure is adopted for a package structure, is illustrated in FIG. 23. Reference numeral 41 indicates a CSP substrate. A large number of bonding pads 42 wire-bonded to their corresponding bonding pads 19 of a flash memory chip 1 are formed over a mounting surface of the flash memory chip 1. When one flash memory chip 1 is mounted on the CSP substrate 41, solder bump electrodes (not shown) connected to their corresponding bonding pads 42 are formed over the back surface of the CSP substrate 41, and the flash memory chip is mounted to a printed circuit board through the solder bump electrodes. Either a structure of a single-layered signal wiring layer or a structure of a multi-layered signal wiring layer can also be adopted for the CSP substrate. Since wirings can freely be routed within the CSP substrate if the number of the signal wiring layers increases, the positions of the solder bump electrodes and bonding pads 42 can be freely laid out. However, the cost of the CSP substrate significantly increases. It is advisable to use a pair of flash memory chips 1 in which interface functions are switched like CORE8 (MCP-A) and MIRROR8 (MCP-A), even when the same type of memory chips are mounted over both surfaces of the CSP substrate. This is because a single-layered signal wiring substrate can be used for the CSP substrate.

Figure 33:
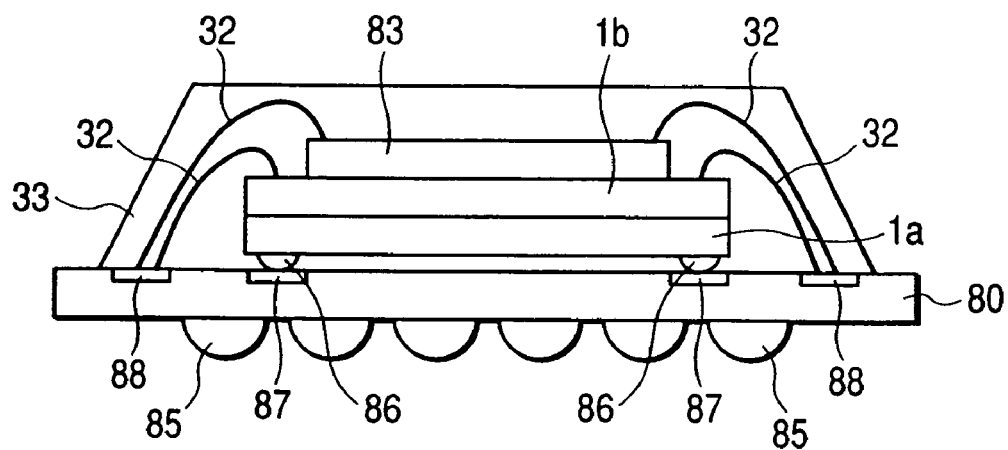
FIG. 33 is a vertical cross-sectional view of another semiconductor device which adopts a CSP structure.
Figure 34:
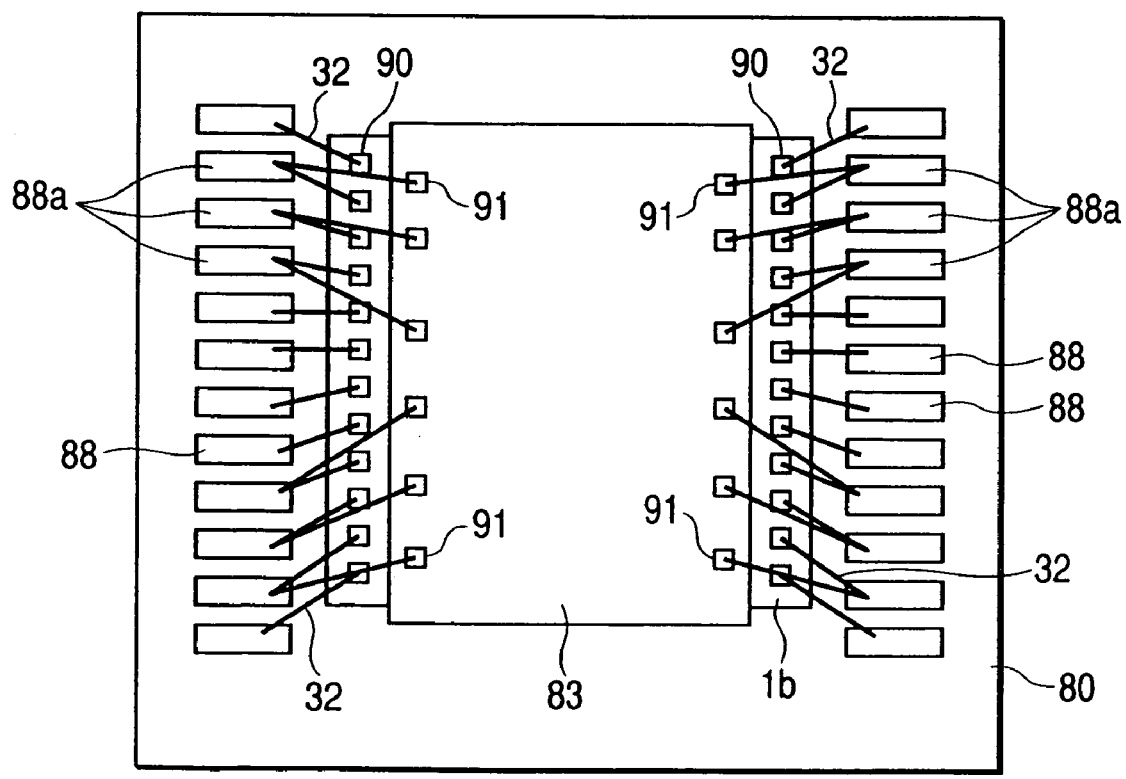
FIG. 34 is a plan view of the semiconductor device shown in FIG. 33.

A vertical sectional structure of another semiconductor device having adopted the CSP structure is illustrated in FIG. 33. A planar structure thereof is illustrated in FIG. 34. Reference numeral 80 indicates a CSP substrate. Two flash memory chips 1a and 1b and a semiconductor chip 83 different in type from the flash memory chips are mounted over the CSP substrate. Solder ball electrodes 85 are formed over the back surface of the CSP substrate 80. Lands 87 with bump electrodes 86 of one flash memory chip 1a mounted thereon, and bonding pads 88 connected to other chips 1b and 83 are formed over the surface of the CSP substrate 80. The lands 87, bonding pads 88 and solder ball electrodes 85 are attained to required connected states via unillustrated wiring layers in the CSP substrate 80.

Both the flash memory chips 1a and 1b may be the flash memory chip (core chip) 1 of the MCP form. Alternatively, the one flash memory chip 1a may be the core chip 1, whereas the other flash memory chip 1b may be the flash memory chip (mirror chip) of the MCP mirror form. Adopting the core chip and the mirror chip makes it possible to simplify wirings for the CSP substrate 80. If the wirings for the CSP substrate 80 are made complex in view of the property of the CSP substrate 80, then both the chips 1a and 1b should unavoidably be configured as core chips. The other semiconductor chip 83 is configured as, for example, other circuit type, e.g., a NOR type flash memory chip. Bonding pads 90 and 91 formed in the chips 1b and 83 are wire-bonded to their corresponding bonding pads 88. When, for example, bonding pads 88a commonly connected with the bonding pads 90 and 91 of the chips 1b and 83 are of address pads, chip selection is individually performed for every chips 1b and 83. Although not illustrated in particular, the chip 1a also shares an address input with other chips 1b and 83, and chip selection is individualized.

<<Specific Example of Switching Circuit>>

Specific examples of switching circuits will now be explained. Each of the switching circuit performs switching between interface functions of predetermined signal bonding pads according to the states of potentials applied to bonding option pads. As is apparent from the description of the bonding option electrodes of FIG. 7, a first switching mode based on a switching circuit corresponds to switching of the interface functions of the predetermined signal bonding pads being valid or invalid. This is equivalent to, for example, a case in which I/O9 through I/O16 are made unavailable selectively. A second switching mode is equivalent to a case in which interface functions are interchanged among a plurality of signal bonding pads. For instance, the second switching mode corresponds to a case in which when the number of parallel data input/output bits is 8 bits, for example, I/O1 and I/O8, I/O2 and I/O7, I/O3 and I/O6, and I/O4 and I/O5 are selectively interchanged with one another.

Figure 24:
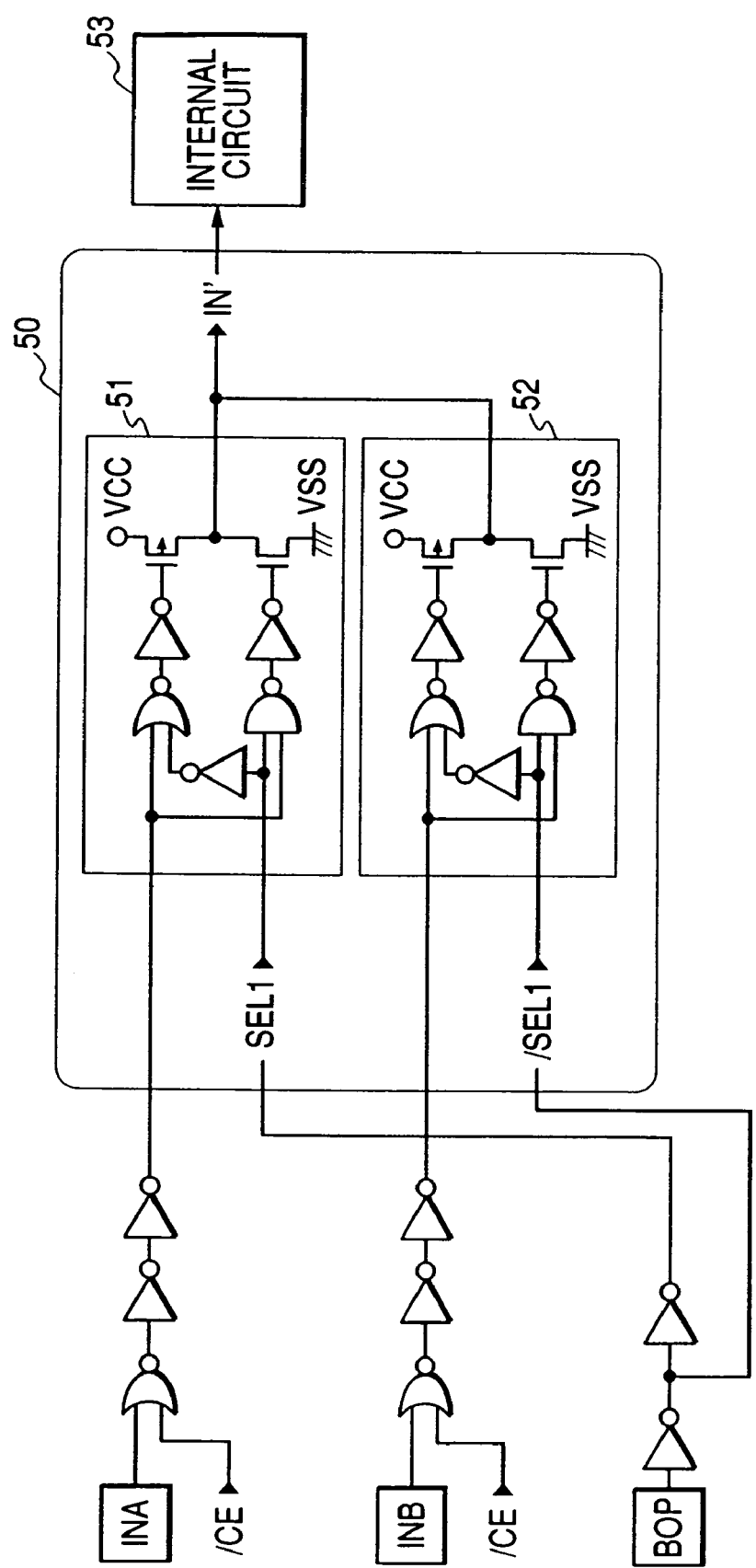
FIG. 24 is a circuit diagram showing one example of a switching circuit according to a first switching mode.

One example of a switching circuit according to the first switching mode is shown in FIG. 24. The example shown in the same figure is configured as a circuit which selects signal input pads. INA and INB indicate signal input pads, and BOP indicates a bonding option pad. Inputs sent from the signal input pads INA and INB are transmittable to their corresponding subsequent stages in a chip-selected state based on /CE. Inputs sent from the bonding option pad BOP are supplied to an input switching circuit 50 as complementary signals SEL1 and /SEL1. The input switching circuit 50 includes an input gate circuit 51 which takes in the input signal sent from the signal input pad INA when the signal SELL is high in level, and an input gate circuit 52 which fetches therein the input signal sent from the signal input pad INA when the signal /SEL1 is high in level. The output of the input gate circuit 51 and the output of the input gate circuit 52 are wired-OR connected to each other and connected to an internal circuit 53. In a pull-up state of the bonding option pad BOP, the input function of the signal input pad INA is made valid and the input function of the signal input pad INB is made invalid. In a pull-down state of the bonding option pad BOP, the signal input functions are respectively set in reverse.

Figure 25:
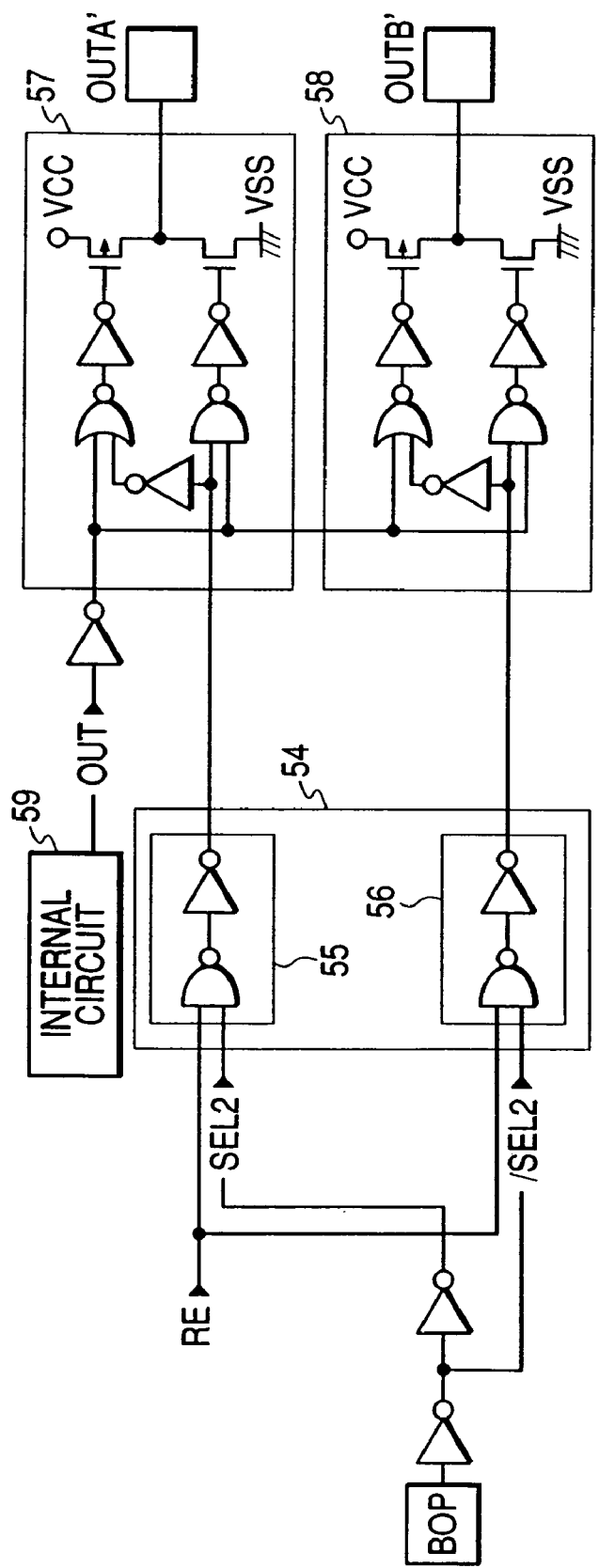
FIG. 25 is a circuit diagram depicting another example of the switching circuit according to the first switching mode.

Another example of the switching circuit according to the first switching mode is shown in FIG. 25. The example shown in the same figure is configured as a circuit which selects signal input pads. Inputs sent from a bonding option pad BOP are supplied to an output switching circuit 54 as complementary signals SEL2 and /SEL2. The output switching circuit 54 includes an output gate circuit 55 which transmits a read enable signal RE to its subsequent stage when the signal SEL2 is high in level, and an output gate circuit 56 which transmits the read enable signal RE when the signal /SEL2 is high in level. OUTA' and OUTB' indicate signal output pads, and BOP indicates the bonding option pad, respectively. Output terminals of output buffer circuits 57 and 58 are connected to their corresponding signal output pads OUTA' and OUTB'. When the output of the output gate circuit 55 is high in level, the output buffer circuit 57 outputs output data OUT supplied from an internal circuit 59 to the signal output pad OUTA'. When the output of the output gate circuit 56 is high in level, the output buffer circuit 58 outputs the output data OUT supplied from the internal circuit 59 to the signal output pad OUTB'. In a pull-up state of the bonding option pad BOP, the output function of the signal output pad OUTA' is made valid, whereas the output function of the signal output pad OUTB' is made invalid. In a pull-down state of the bonding option pad BOP, the signal output functions thereof are reversed respectively.

Figure 26:
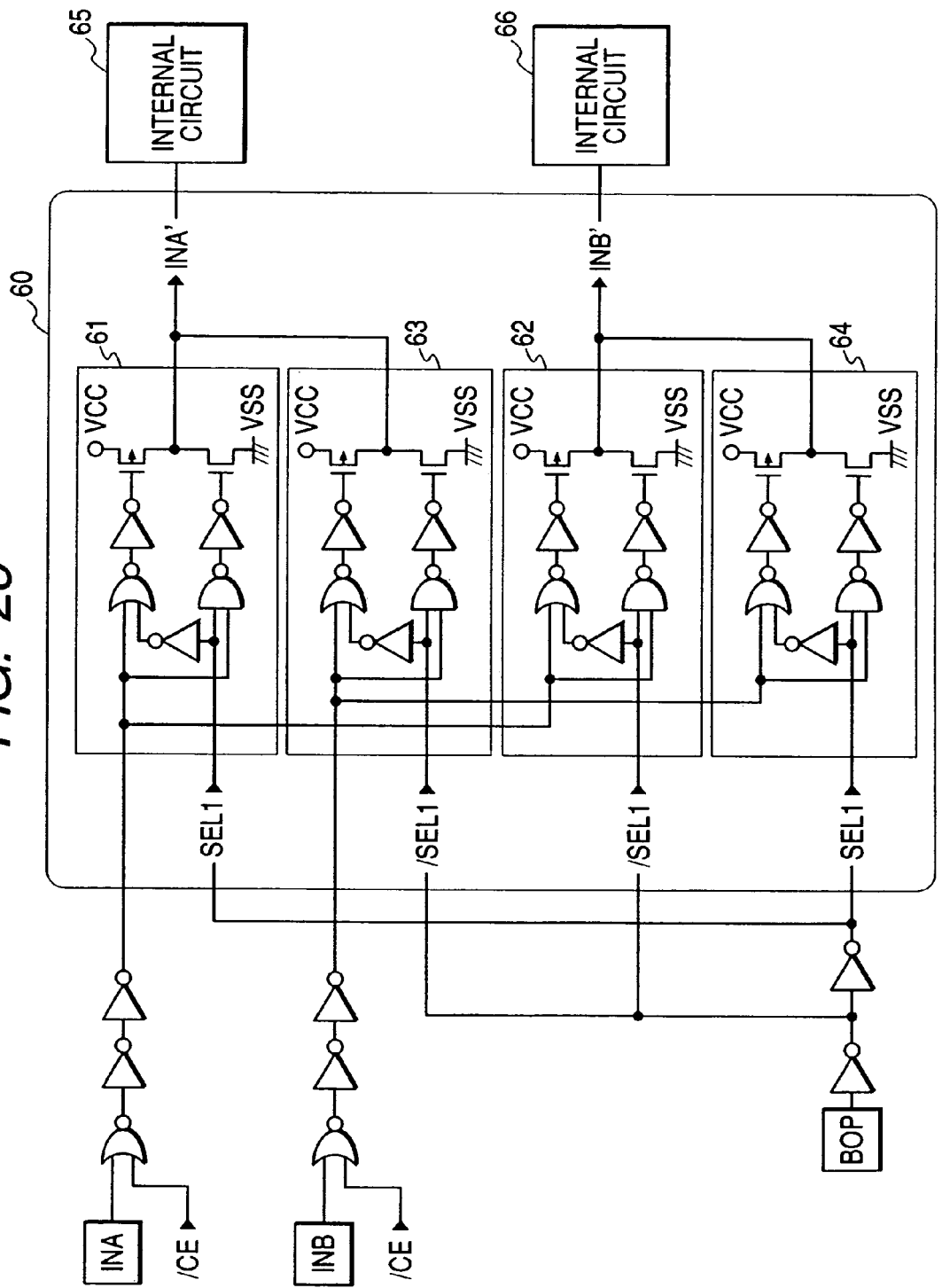
FIG. 26 is a circuit diagram showing one example of a switching circuit according to a second switching mode.

On example of a switching circuit according to the second switching mode is shown in FIG. 26. The example shown in the same figure is configured as a circuit which interchanges the functions of signal input pads. INA and INB indicate signal input pads, and BOP indicates a bonding option pad. Inputs sent from the signal input pads INA and INB are made transmittable to their corresponding subsequent stages in a chip-selected state based on /CE. Inputs sent from the bonding option pad BOP are supplied to an input switching circuit 60 as complementary signals SEL1 and /SEL1. The input switching circuit 60 includes an input gate circuit 61 which takes in the input signal sent from the signal input pad INA when the signal SEL1 is high in level, an input gate circuit 62 which fetches therein the input signal sent from the signal input pad INA when the signal /SEL1 is high in level, an input gate circuit 63 which fetches therein the input signal sent from the signal input pad INB when the signal /SEL1 is high in level, and an input gate circuit 64 which takes in the input signal sent from the signal input pad INB when the signal SEL1 is high in level. The output of the input gate circuit 61 and the output of the input gate circuit 63 are wired-OR connected to each other and connected to an internal circuit 65. The output of the input gate circuit 62 and the output of the input gate circuit 64 are wired-OR connected to each other and connected to an internal circuit 66. In a pull-up state of the bonding option pad BOP, the input from the signal input pad INA is made inputtable to the internal circuit 65 via the input gate circuit 61. The input from the signal input pad INB is made inputtable to the internal circuit 66 via the input gate circuit 64. In a pull-down state of the bonding option pad BOP, the signal input functions are switched so that the input from the signal input pad INA is made inputtable to the internal circuit 66 via the input gate circuit 62, and the input from the signal input pad INB is made inputtable to the internal circuit 65 via the input gate circuit 63.

Figure 27:
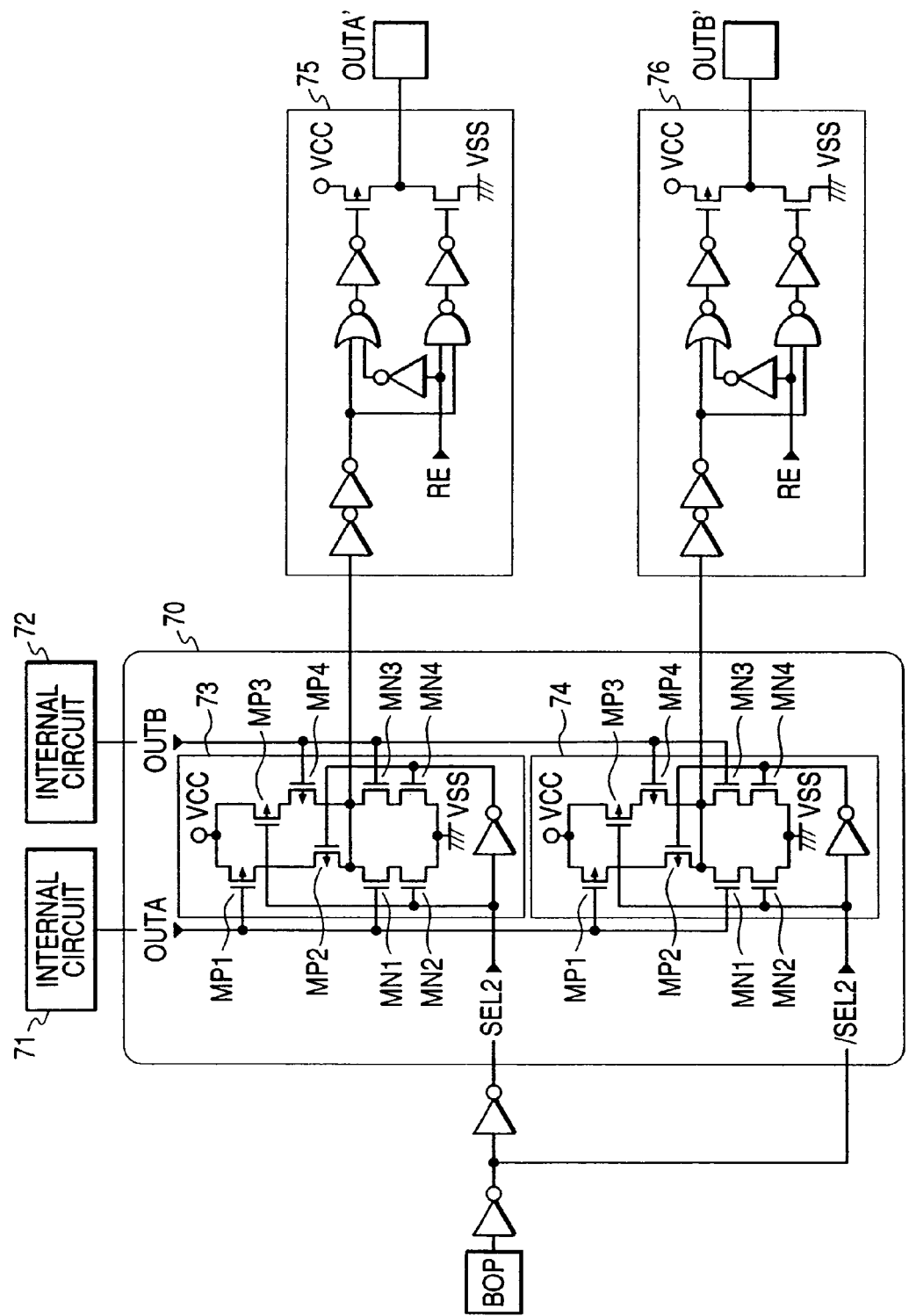
FIG. 27 is a circuit diagram depicting another example of the switching circuit according to the second switching mode.

Another example of the switching circuit according to the second switching mode is shown in FIG. 27. The example shown in the same figure is configured as a circuit which interchanges output functions of signal output pads. Inputs sent from a bonding option pad BOP are supplied to an output switching circuit 70 as complementary signals SEL2 and /SEL2. The output switching circuit 70 includes an output gate circuit (output selection circuit) 73 which selects an output OUTA of an internal circuit 71 when the signal SEL2 is high in level and which selects an output OUTB of an internal circuit 72 when the signal SEL2 is low in level and transmits it to its subsequent stage, and an output gate circuit (output selection circuit) 74 which selects the output OUTA of the internal circuit 71 when the signal /SEL2 is high in level and which selects the output OUTB of the internal circuit 72 when the signal /SEL2 is low in level and transmits it to its subsequent stage. The output gate circuits 73 and 74 both comprise p channel type MOS transistors MP1 through MP4 and n channel type MOS transistors MN1 through MN4. The transistors MP3 and MN4 are configured so as to selectively cut off a transmission path for the signal OUTB, and the transistors MP2 and MN2 are configured so as to selectively cut off a transmission path for the signal OUTA. OUTA' and OUTB' indicate signal output pads respectively. Output terminals of the output buffer circuits 75 and 76 are respectively connected to the signal output pads OUTA' and OUTB'. When a read enable signal RE is in an active state (high in level), the output buffer circuit 75 outputs the output of the output gate circuit 73 to the signal output pad OUTA'. When the read enable signal RE is in the active state (high in level), the output buffer circuit 76 outputs the output of the output gate circuit 74 to the signal output pad OUTB'. Since the SEL2 is brought to a high level and the /SEL2 is brought to a low level in a pull-up state of the bonding option pad BOP, the output pad OUTA' is assigned to the output of the output signal OUTA of the internal circuit 71, and the output pad OUTB' is assigned to the output of the output signal OUTB of the internal circuit 72. Since the SEL2 and the /SEL2 are respectively brought to the low level and the high level contrary to the above in a pull-down state of the bonding option pad BOP, the output pad OUTA' is assigned to the output of the output signal OUTB of the internal circuit 72, and the output pad OUTB' is assigned to the output of the output signal OUTA of the internal circuit 71.

<<Switching of Control Functions by Bonding Options>>

A description will next be made of switching between control functions by bonding options. The function of switching by the bonding option pad B.O.AdU shown in FIG. 7 will be explained here. This function is realized by a controller (CNT) 10A (see FIG. 1) included in the internal control circuit 10.

Figure 28:
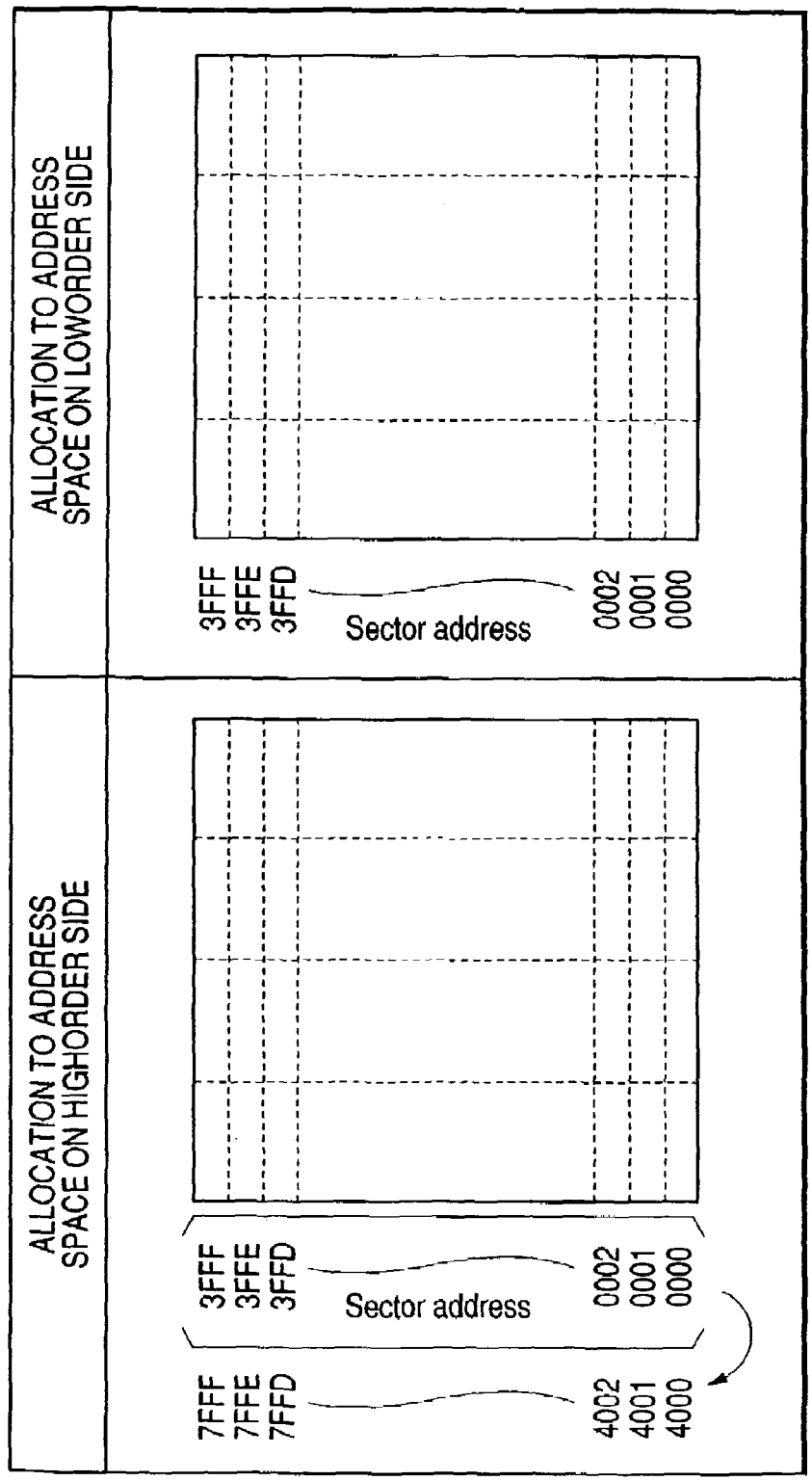
FIG. 28 is an address map showing a state in which discrete address spaces are allocated to select flash memory chips separately and allow the selected one to perform an access operation.

When the pair of flash memory chips 1 described in FIG. 20 is mounted, the bonding pads for selection of addresses, data and chips are connected in common between the flash memory chips 1 to provide MCP structurization. In order to select the flash memory chips 1 separately and cause the selected chip to perform an access operation at this time, there is a need to assign discrete address spaces as in the case where an address space ranging from 0000 to 3FFF is assigned to one flash memory chip, and an address space ranging from 4000 to 7FFF is assigned to the other flash memory chip as illustrated in FIG. 28 by way of example. Both the flash memory chips 1 are placed in the same space when left intact, and they are no more than merely parallel-operated.

Thus, when the bonding option pad B.O.AdU is made open, a low-order side address space is assigned to the corresponding flash memory chip. When the bonding option pad B.O.AdU is set to a ground potential VSS, a high-order side address space is assigned to the corresponding flash memory chip. The value of I/O7 in the address input cycle of SA2 described in FIG. 4 is used for the assignment of the address spaces to the chips. That is, when the bonding option pad B.O.AdU is set to the ground potential VSS, a command input relevant to the address input cycle of SA2 is made valid on condition that the value of I/O7 in the address input cycle of SA2 is high in level. If the value of I/O7 is low in level, then the command input relevant to the address input cycle becomes invalid, so that no access operation is done. When the bonding option pad B.O.AdU is made open, the value of I/O7 in the address input cycle of SA2 is ignored.

Here, the input of I/O7 in the address input cycle of SA2 is ranked as a bit higher by one than the address most significant bit of the flash memory chip 1. In the case of a flash memory chip in which the operation as for a ×8 device using I/O1 through I/O8 is selected, an address input form in an address input cycle is configured such that a column address is 11 bits and a sector address is 14 bits as illustrated in FIG. 29. The most significant bit A24 for each of the sector addresses SA1 and SA2 is inputted to I/O6. The input of a high level from I/O7 ranked one higher than I/O6 is regarded as an access request to a high-order space. In the case of a flash memory chip in which the operation as for a ×16 device using I/O1 through I/O16 is selected, an address input form in an address input cycle is configured such that a column address is 10 bits and a sector address is 14 bits as illustrated in FIG. 30. The most significant bit A23 for each of the sector addresses SA1 and SA2 is inputted to I/O6. The input of a high level from I/O7 ranked one higher than I/O6 is regarded as an access request to a high-order space. Incidentally, symbols L★ in FIGS. 29 and 30 mean that they are used with being fixed to a low level. Symbols L/H mean that they are settable to a low level or a high level.

In a use form in which the selection of the flash memory chips 1 and the address input are respectively made common in such a MCP structure as described in FIG. 20, the bonding option pad B.O.AdU is made open with respect to one flash memory chip 1, and the bonding option pad B.O.AdU is pulled down to the ground potential VSS with respect to the other flash memory chip 1. When the input sent from I/O7 in the address input cycle SA2 is high in level, the access operation of the other flash memory chip 1 is enabled, whereas when the input from the I/O7 is low in level, the operation of the one flash memory chip is enabled. Thus, when the external connecting electrodes for the selection of addresses, data and chips are connected in common between the flash memory chips 1 to provide MCP structurization, the corresponding flash memory chip 1 is selected and made accessible, so that the address space as seen from outside the semiconductor device can be extended.

Figure 31:
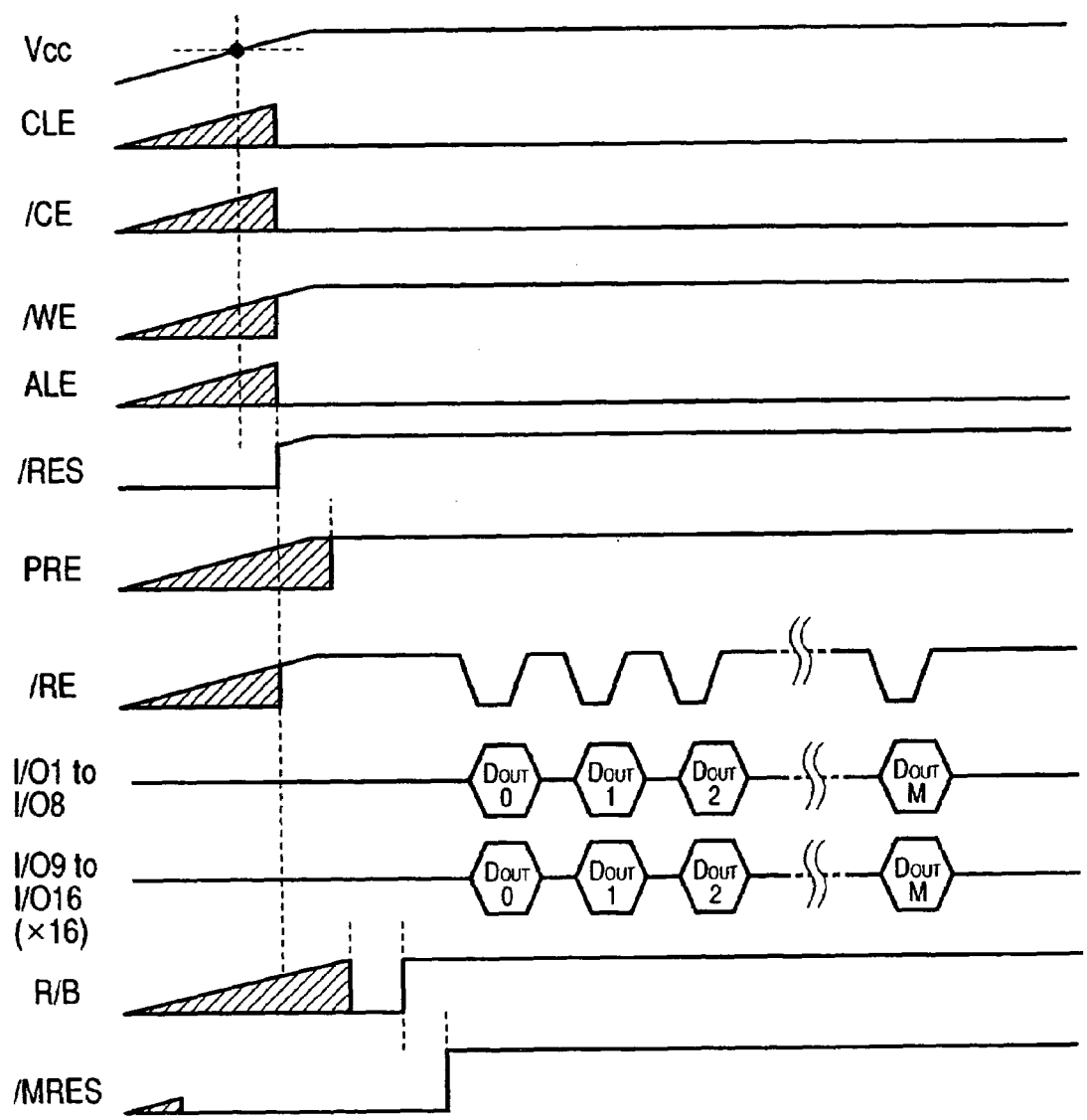
FIG. 31 is a timing chart showing a power-on read operation.

In the use form in which the selection of the flash memory chips.1 and the address input are respectively made common in such a MCP structure as described in FIG. 20, a power-on read operation for the flash memory chip 1 in which the bonding option pad B.O.AdU is pulled down to the ground potential in association with power-on-read instructions is restrained. Thus, when the power-on-read is instructed, both the pair of flash memory chips mounted in the MCP form are operated to make it possible to prevent inconvenience developed due to collision of read data before happens. A timing chart showing a power-on-read operation is illustrated in FIG. 31.

Figure 32:
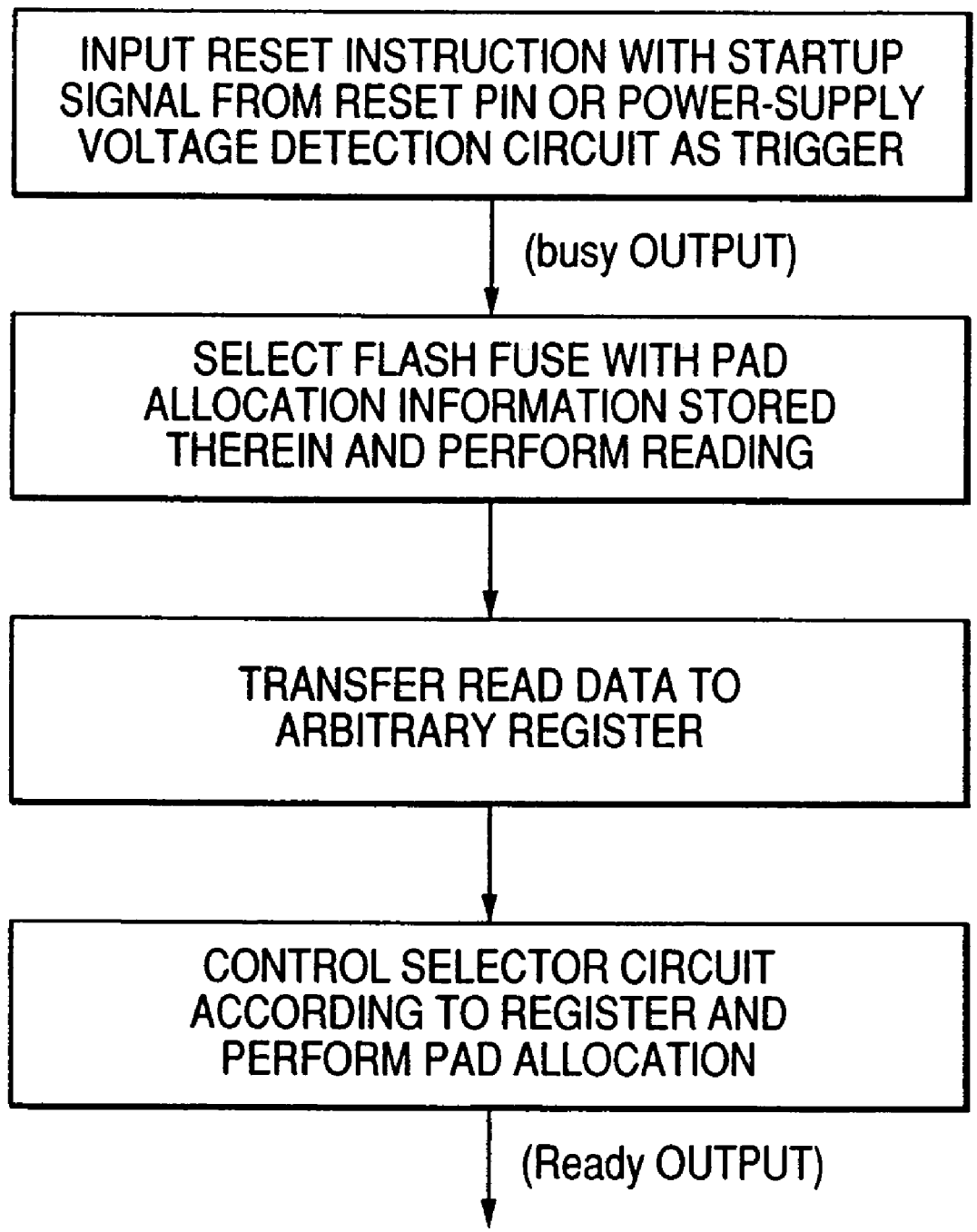
FIG. 32 is a flowchart illustrating an internal operation sequence at power-on where a flash fuse is used.

A form of the invention according to a further aspect, which relates to an interface function switching circuit, will be explained. The switching circuit included in a semiconductor chip formed with a plurality of circuit elements and a plurality of external connecting electrodes may be configured so as to perform switching between interface functions of the external connecting electrodes in accordance with a program state relative to a fuse. The fuse is defined as a laser fuse which stores information corresponding to the presence or absence of cutoff thereof by laser, an electrical fuse which stores information corresponding to the presence or absence of cutoff thereof by Joule heat, or an electrically erasable-programmable flash fuse. The flash fuse must perform reading of stored information in response to reset instructions. Thus, the flash fuse must be excepted from an interface function switching application of a reset external connecting electrode to which instructions as to a reset operation are inputted. This is because since the information stored in the flash fuse is normally read in response to the instructions as to the reset operation and thereby initially set to an internal register or the like, it is disadvantageous to use the flash fuse in the interface function switching application of the reset external connecting electrode to which the instructions as to the reset operation are inputted. In brief, the allocation of the reset terminal and power supply terminals must be established before reading of the flash fuse. If it is taken into. consideration, then an internal operation sequence at power-on where the flash fuse is used, is set as shown in FIG. 32, for example.

While the invention made above by the present inventors has been described specifically on the basis of the preferred embodiments, the present invention is not limited to the embodiments referred to above. It is needless to say that various changes can be made thereto without the scope not departing from the gist thereof.

For example, the semiconductor memory chip is not limited to the flash memory chip and may be other memory type memory chips such as an SRAM, a synchronous DRAM, an EEPROM, etc. In the case of the MCP structure, the mounted number of chips is not limited to two and may be greater than two. The functions and array of the bonding pads are not limited to the above description. They can be suitably changed. The layouts among the bonding pads which make it possible to interchange the signal interface functions, are not limited to such a configuration that they are symmetrical with respect to the line intersecting the longitudinal side of the chip. The layouts may be configured substantially symmetrical with respect to the line extending along the longitudinal side. However, the former becomes simple as compared with the latter in terms of the configuration such as wiring routing made inside the chip, which is necessary for interface switching. Further, the memory card is not limited to MMC but is applicable even to other memorycard-Spec memory card. The present invention can be grasped as a semiconductor memory chip per se.

What is claimed is:

1. A semiconductor device comprising:
   a die pad having a first surface and a second surface opposed to the first surface;
   leads including a first lead, a second lead, a third lead and a fourth lead, the leads being spaced from the die pad;
   a first semiconductor memory chip mounted over the first surface of the die pad;
   a second semiconductor memory chip mounted over the second surface of the die pad;
   each said semiconductor memory chip having a first external electrode and a second external electrode, the first and second external electrodes of the semiconductor chips each being connected to a different one of the first to fourth leads by a corresponding wire; and
   a sealing resin sealing the die pad, a part of each said lead, the first semiconductor memory chip, the second semiconductor memory chip, and each said wire;
   wherein the first semiconductor memory chip is of the same design as the second semiconductor memory chip; and
   wherein each said semiconductor memory chip includes a switching circuit that can perform switching between interface functions of the second external electrode of the chip based on a potential applied to the first external electrode of the chip.

2. The semiconductor device according to claim 1, wherein the second external electrode of each said semiconductor memory chip is an electrode used in plural-bit parallel input/output or control-signal input.

3. The semiconductor device according to claim 2, wherein each said semiconductor memory chip includes an external electrode for power supply and which is not used for interface function switching.

4. The semiconductor device according to claim 1, wherein each said switching circuit is constructed to set valid and invalid states of an interface function.

5. The semiconductor device according to claim 1, wherein said switching circuit of one of said semiconductor memory chips is used in effecting an interchange of interface functions between the second external electrode and a further external electrode of said one chip.

6. The semiconductor device according to claim 5, wherein each said semiconductor memory chip has a back surface facing the die pad.

7. The semiconductor device according to claim 5, wherein the second electrode of each said semiconductor memory chip is one of a plurality of external electrodes for switching of interface functions and which have layouts symmetrical with respect to predetermined position along one side of the chip.

8. The semiconductor device according to claim 1, wherein each said semiconductor memory chip further includes a control circuit which can perform switching of a control function for an input sent from a predetermined external electrode in accordance with a state of a potential applied to a third external electrode.

9. The semiconductor device according to claim 8,
   wherein the control circuit judges a command input relevant to an address input cycle as invalid where a bit ranked as being higher by one than an address most significant bit, which is inputted in the address input cycle, has a first logical value when the third external electrode has a first potential state, and judges as valid a command input relevant to an address input cycle when said bit has a second logical value, and
   wherein when the third external electrode has a second potential state, the control circuit ignores the bit ranked as being higher by one than the address most significant bit.

10. The semiconductor device according to claim 9, wherein when the third external electrode has the first potential state where an instruction for a read operation with no address input is given, the control circuit inhibits the start of the read operation.

* * * * *